(12) United States Patent
Osawa et al.

(10) Patent No.: US 8,043,468 B2
(45) Date of Patent: *Oct. 25, 2011

(54) APPARATUS FOR AND METHOD OF PROCESSING SUBSTRATE

(75) Inventors: Atsushi Osawa, Kyoto (JP); Yoshitaka Abiko, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 403 days.

This patent is subject to a terminal disclaimer.

(21) Appl. No.: 12/207,633

(22) Filed: Sep. 10, 2008

(65) Prior Publication Data

US 2009/0080879 A1   Mar. 26, 2009

(30) Foreign Application Priority Data

Sep. 26, 2007 (JP) ................................ 2007-248748
Sep. 26, 2007 (JP) ................................ 2007-249010

(51) Int. Cl.
*H01L 21/306* (2006.01)
*C23F 1/00* (2006.01)

(52) U.S. Cl. ......... 156/345.18; 156/345.11; 156/345.13; 156/345.21

(58) Field of Classification Search .................. 156/345, 156/345.11, 345.21, 345.13, 345.18
See application file for complete search history.

(56) References Cited

U.S. PATENT DOCUMENTS

| | | | | |
|---|---|---|---|---|
| 5,980,129 | A * | 11/1999 | Yale | 396/619 |
| 6,780,277 | B2 * | 8/2004 | Yokomizo et al. | 156/345.11 |
| 7,541,285 | B2 * | 6/2009 | Abiko et al. | 438/689 |
| 2005/0258085 | A1 * | 11/2005 | Hiroe et al. | 210/167 |
| 2006/0213542 | A1 * | 9/2006 | Abiko et al. | 134/61 |
| 2008/0023444 | A1 * | 1/2008 | Osawa | 216/83 |
| 2008/0096393 | A1 * | 4/2008 | Kim et al. | 438/745 |
| 2009/0080879 | A1 * | 3/2009 | Osawa et al. | 396/626 |
| 2009/0239384 | A1 * | 9/2009 | Fujiwara et al. | 438/745 |

FOREIGN PATENT DOCUMENTS

| | | |
|---|---|---|
| CN | 1963992 | 5/2007 |
| JP | 2000-70827 | 3/2000 |
| JP | 2001-196343 | 7/2001 |
| JP | 2004-281728 | 10/2004 |
| JP | 2005-26478 A | 1/2005 |
| JP | 2007-36189 | 2/2007 |
| JP | 2007-49022 | 2/2007 |

OTHER PUBLICATIONS

Decision to Grant issued by Korean Patent Office on Aug. 23, 2010 in connection with corresponding Korean application No. 10-2008-0090369.

(Continued)

*Primary Examiner* — Sylvia R. MacArthur
(74) *Attorney, Agent, or Firm* — Ostrolenk Faber LLP

(57) ABSTRACT

A substrate processing apparatus discharges a hydrofluoric acid solution from discharge nozzles toward grooves formed in side walls of an inner bath. The hydrofluoric acid solution discharged from the discharge nozzles impinges upon the grooves to diffuse, thereby moving toward a top portion of the inner bath in the form of low-speed uniform liquid flows. Thus, a metal component and foreign substances generated in the inner bath float up toward the top portion of the inner bath without being agitated within the inner bath, and are rapidly drained to an outer bath together with the hydrofluoric acid solution.

15 Claims, 15 Drawing Sheets

OTHER PUBLICATIONS

Office Action issued by Korean Patent Office on May 27, 2010 in connection with corresponding Korean patent application No. 10-2008-0090369.

English translation of relevant portions of Korean Office Action issued May 27, 2010.

Chinese Office Action dated Dec. 18, 2009 with English translation.

* cited by examiner

F I G. 5
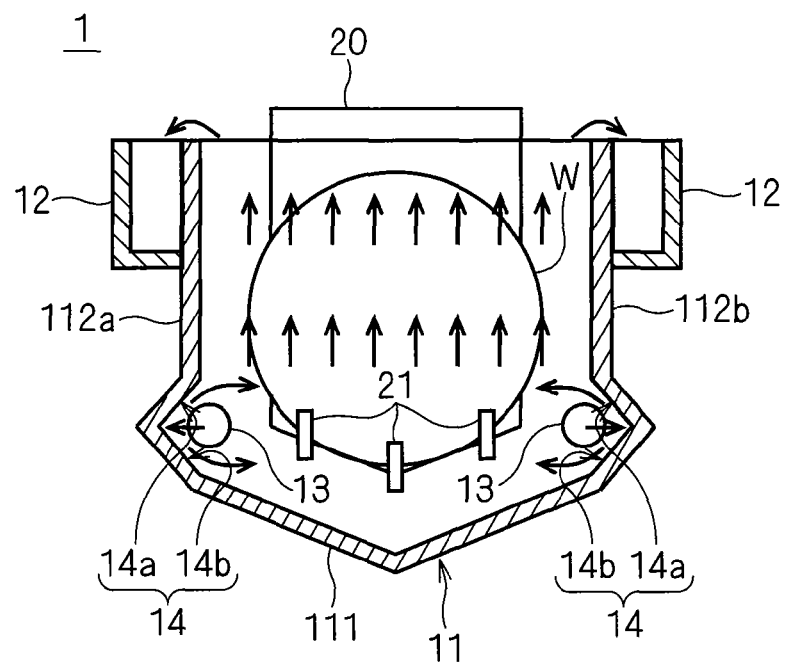
F I G. 6
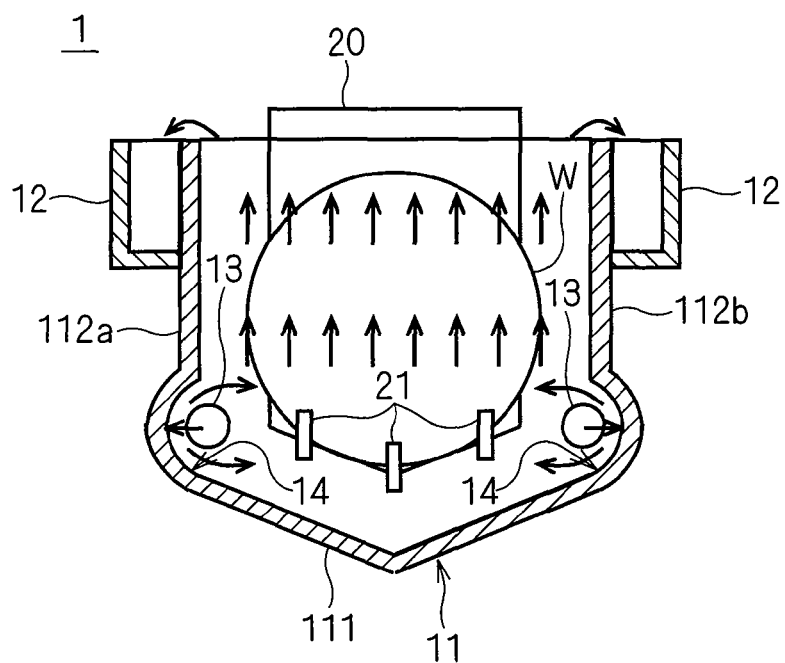

F I G . 9
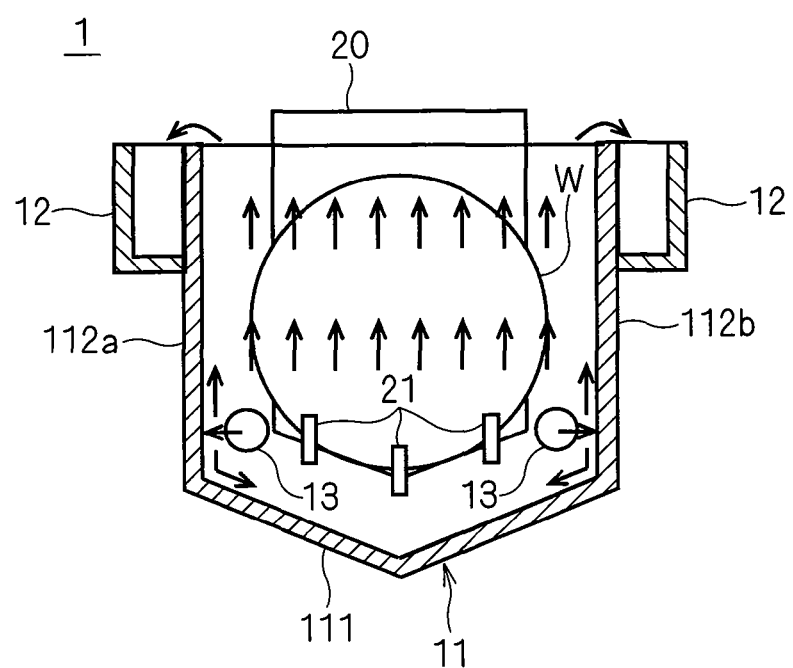

F I G . 1 0
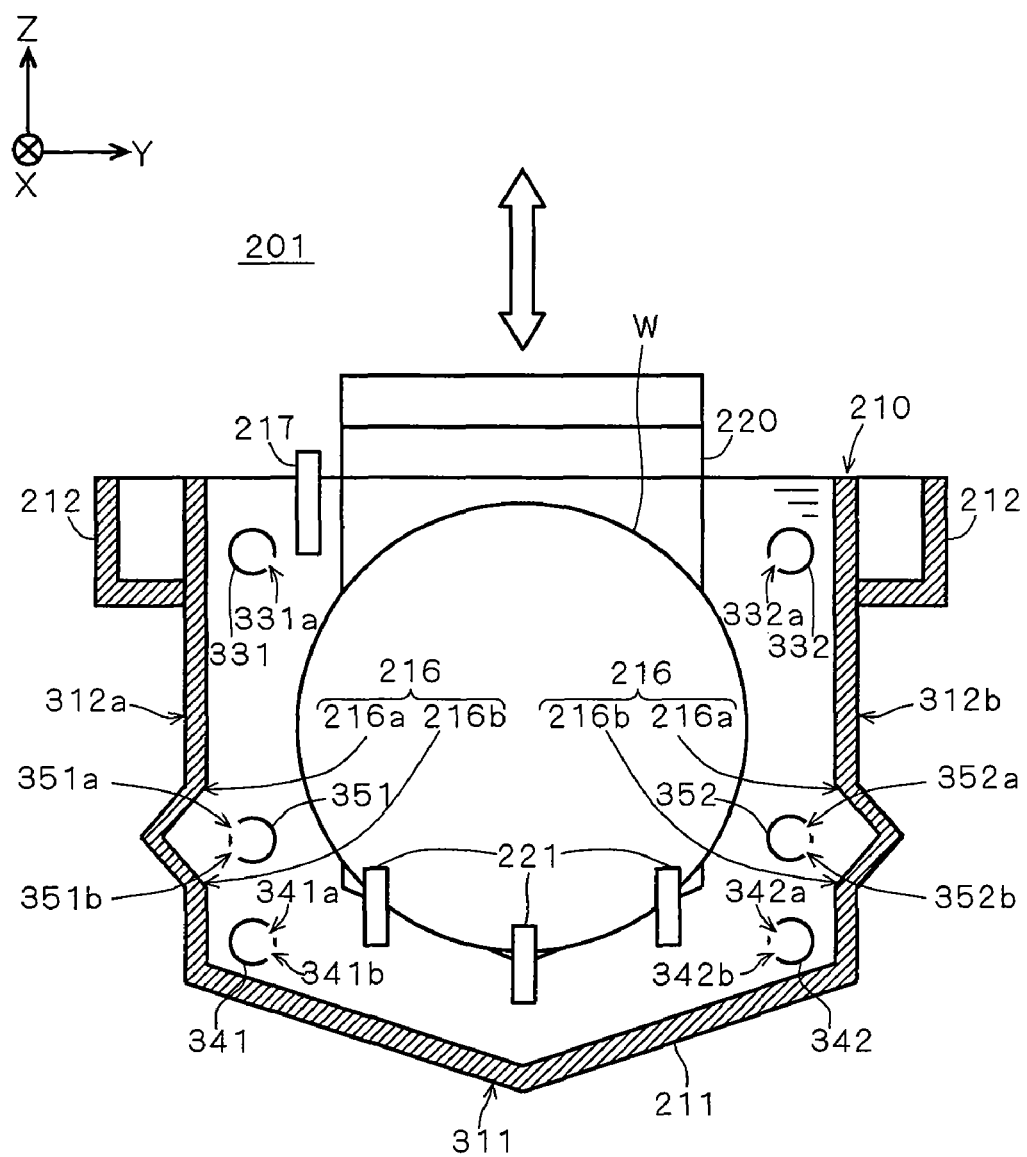

F I G . 1 8
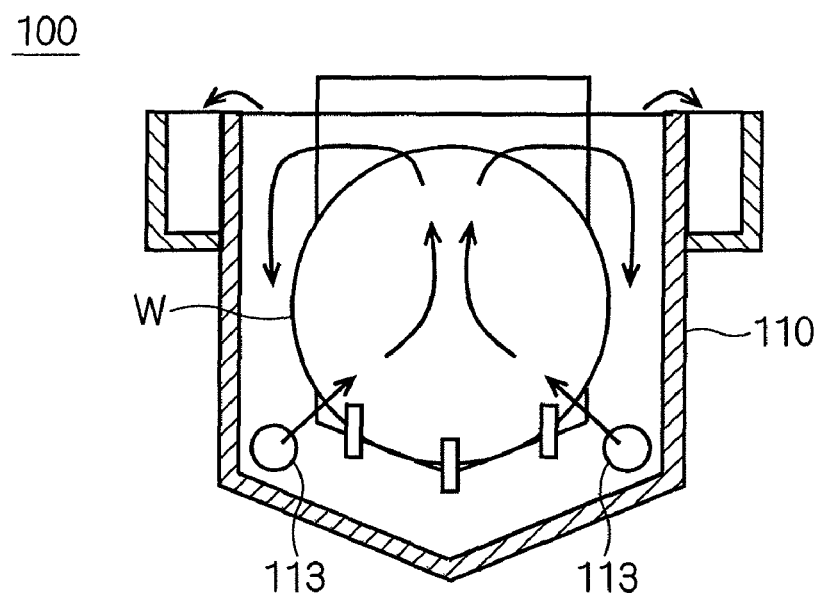
Prior Art

APPARATUS FOR AND METHOD OF PROCESSING SUBSTRATE

BACKGROUND OF THE INVENTION

1. Field of the Invention

The present invention relates to a substrate processing apparatus for performing a cleaning process, an etching process and other processes upon substrates such as semiconductor substrates, glass substrates for a liquid crystal display device, glass substrates for a photomask and the like by dipping the substrates in a processing liquid.

2. Description of the Background Art

In the process of manufacturing substrates, a substrate processing apparatus is used which processes the substrates by dipping the substrates in a processing liquid stored in a processing bath. FIG. 18 is a view showing an example of a background art substrate processing apparatus 100. As shown in FIG. 18, the background art substrate processing apparatus 100 includes a processing bath 110 for storing a processing liquid therein, and causes the processing liquid to overflow from a top portion of the processing bath 110 while discharging the processing liquid from discharge nozzles 113 provided in a bottom portion of the processing bath 110 to supply the processing liquid to around substrates W, thereby processing the substrates W.

In particular, a substrate processing apparatus of what is called a one-bath type discharges a plurality of types of processing liquids such as an etchant, a cleaning liquid, deionized water and the like in sequential order from the discharge nozzles 113. Such a substrate processing apparatus stores the plurality of types of processing liquids in sequential order within the processing bath 110 to thereby perform a plurality of types of processes in sequential order upon the substrates W.

As shown in FIG. 18, the discharge nozzles 113 in the background art substrate processing apparatus 100 are designed to discharge the processing liquid toward the substrates W within the processing bath 110. Thus, the processing liquid discharged from the discharge nozzles 113 forms relatively high-speed liquid flows within the processing bath 110 and is agitated all over the inside of the processing bath 110. Such a conventional form of discharge, however, is intended to agitate the processing liquid all over the inside of the processing bath 110, and is not capable of efficiently draining a used processing liquid from the processing bath 110 to replace the used processing liquid with a new processing liquid.

In such a background art substrate processing apparatus 100, foreign substances such as particles, if contained within the processing bath 110, are also agitated together with the processing liquid within the processing bath 110. Thus, the background art substrate processing apparatus 100 is not capable of rapidly remove the foreign substances contained within the processing bath 110 from the processing bath 110. Such foreign substances are deposited onto the surfaces of the substrates W being processed to give rise to apprehensions about the contamination of the substrates W and about the processing failures of the substrates W. In particular, when an acid chemical liquid is used as the processing liquid or when substrates W having hydrophobic surfaces are used, the foreign substances such as particles are prone to adhere to the surfaces of the substrates W to make the above-mentioned problem more serious.

For the substrate processing apparatus of the one-bath type, it is desired in some cases to uniformly process the substrates W as in an etching process, and it is desired in other cases to efficiently replace a processing liquid stored within the processing bath with another processing liquid. For the uniform processing of the substrates W, it is desirable to form a relatively high-speed liquid flow within the processing bath, thereby making the concentration of the processing liquid stored within the processing bath uniform. For the efficient replacement of the processing liquid stored within the processing bath with another processing liquid, on the other hand, it is desirable to form a relatively low-speed liquid flow within the processing bath, thereby discharging the processing liquid in such a manner as to force the processing liquid outwardly from the top portion of the processing bath.

The background art substrate processing apparatus, however, is configured to discharge the processing liquid from the pair of discharge nozzles 113 toward the inside of the processing bath 110, as described above. Because of such a configuration, it is difficult to form different liquid flows within the processing bath 110 depending on processing conditions. The background art substrate processing apparatus is not capable of satisfying both the requirement for improvements in processing uniformity of the processing liquid and the requirement for efficient replacement of the processing liquid stored within the processing bath with another processing liquid.

SUMMARY OF THE INVENTION

The present invention is intended for a substrate processing apparatus for processing a substrate by dipping the substrate in a processing liquid.

According to the present invention, the substrate processing apparatus comprises: a processing bath having a side wall and a bottom wall for storing the processing liquid therein; a first discharge part for discharging the processing liquid toward one of the side wall and the bottom wall within the processing bath; a drainage part for draining the processing liquid overflowing from a top portion of the processing bath; and a lifter for moving the substrate upwardly and downwardly between the inside of the processing bath and a position over the processing bath.

The processing liquid discharged from the first discharge part impinges upon the side wall or the bottom wall to diffuse, thereby moving toward the top portion of the processing bath in the form of low-speed uniform liquid flows. Thus, a metal component and foreign substances generated in the processing bath float up toward the top portion of the processing bath without being agitated within the processing bath, and are rapidly drained to the outside of the processing bath together with the processing liquid. Further, there is no need to complicate the structure of the first discharge part itself. This suppresses the manufacturing costs of the substrate processing apparatus.

Preferably, the first discharge part discharges the processing liquid toward a recessed portion formed in one of the side wall and the bottom wall.

The processing liquid diffused by the side wall or the bottom wall is moved toward a central portion of the processing bath. Thus, the low-speed uniform flows of processing liquid are formed well around the substrate dipped in the processing liquid.

Preferably, the first discharge part has a pair of discharge nozzles, and the pair of discharge nozzles discharge the processing liquid toward recessed portions formed in a pair of opposed side walls, respectively, of the processing bath.

The flows of processing liquid diffused by the pair of side walls are joined together near the central portion of the processing bath to move upwardly from near the central portion of the processing bath.

Preferably, the recessed portions are formed in lower end portions of the pair of opposed side walls, respectively.

The processing liquid is diffused near the bottom portion of the processing bath to form flows of processing liquid directed upwardly from the bottom portion of the processing bath well.

Preferably, each of the recessed portions is a groove of a V-shaped cross-sectional configuration opening to the inside of the processing bath.

The recessed portions are easily formed in the respective side walls of the processing bath. Further, the direction in which the processing liquid moves is easily determined by the inclination of tapered surfaces defining the groove of the V-shaped cross-sectional configuration.

Preferably, the groove of the V-shaped cross-sectional configuration is defined by a pair of tapered surfaces, and each of the pair of discharge nozzles discharges the processing liquid toward a lower one of the pair of tapered surfaces.

More processing liquid is moved toward the vicinity of the bottom portion of the processing bath.

Preferably, each of the recessed portions is a groove having the shape of a curved surface opening to the inside of the processing bath.

The direction in which the processing liquid moves is determined more appropriately.

Preferably, the substrate processing apparatus further comprises: a second discharge part for discharging the processing liquid toward the inside of the processing bath; and a controller for individually controlling the operation of the first discharge part and the operation of the second discharge part depending on the progress of processing, wherein the processing liquid discharged from the first discharge part impinges upon an inner wall surface of the processing bath to thereby form a liquid flow within the processing bath, the liquid flow being lower in speed than that of the processing liquid discharged from the second discharge part.

When it is desired to improve the uniformity of the processing with the processing liquid, the second discharge part is used to form relatively high-speed liquid flows within the processing bath, thereby making the concentration of the processing liquid within the processing bath uniform. When it is desired to efficiently replace the processing liquid within the processing bath with another processing liquid, the first discharge part is used to form relatively low-speed liquid flows within the processing bath, thereby accomplishing the efficient drainage of the processing liquid from the processing bath.

Preferably, the first discharge part discharges the processing liquid toward a recessed portion formed in the inner wall surface of the processing bath.

The processing liquid discharged from the first discharge part is moved well toward the inside of the processing bath.

Preferably, the second discharge part has a first nozzle disposed near a bottom portion of the processing bath, and a second nozzle disposed near the top portion of the processing bath, and the first discharge part has a third nozzle disposed above the first nozzle near the bottom portion of the processing bath.

The processing liquid is uniformly discharged from the second discharge part into the processing bath, and the processing liquid is discharged from the first discharge part toward the vicinity of the bottom portion of the processing bath.

Preferably, the first nozzle includes a pair of first nozzles disposed on opposite sides of a region in which the substrate is dipped in the processing liquid within the processing bath, the second nozzle includes a pair of second nozzles disposed on opposite sides of the region, and the third nozzle includes a pair of third nozzles disposed on opposite sides of the region.

Flows of processing liquid free of nonuniformity are formed near the substrate dipped in the processing liquid stored within the processing bath.

Preferably, the processing liquid includes an etchant for execution of an etching process on the substrate, and a non-etching liquid for execution of another process, and the controller causes the second discharge part to discharge the etchant when supplying the etchant to the inside of the processing bath.

The uniform concentration of the etchant component is achieved within the processing bath to allow the etching process to proceed uniformly on the main surface of the substrate.

Preferably, the substrate processing apparatus further comprises a measurement part for measuring one of the concentration of the component of the etchant contained in the processing liquid stored within the processing bath and the resistivity value of the processing liquid, wherein the controller causes the second discharge part to discharge the non-etching liquid when replacing the etchant stored within the processing bath with the non-etching liquid, and wherein the controller causes the second discharge part to stop discharging the non-etching liquid and causes the first discharge part to discharge the non-etching liquid when a measurement value obtained by the measurement part reaches a predetermined value.

While the etchant component remains in certain amounts within the processing bath, the second discharge part discharges the processing liquid to make the concentration of the etchant component uniform. After the etchant component is drained in certain amounts out of the processing bath, the first discharge part discharges the processing liquid to efficiently drain the remaining etchant component from the processing bath.

Preferably, when replacing the processing liquid stored within the processing bath with a second processing liquid, the controller causes the discharge of the second processing liquid from the second discharge part and the discharge of the second processing liquid from the first discharge part in an alternating manner.

The processing liquid is efficiently replaced while the component of the processing liquid remaining near the substrate is agitated.

The present invention is also intended for a method of processing a substrate by dipping the substrate in a processing liquid.

According to the present invention, the method comprises the steps of: a) discharging the processing liquid toward one of a side wall and a bottom wall of a processing bath within the processing bath; and b) dipping the substrate in the processing liquid stored within the processing bath.

The processing liquid discharged in the step a) impinges upon the side wall or the bottom wall of the processing bath to diffuse, thereby moving toward the top portion of the processing bath in the form of low-speed uniform liquid flows. Thus, foreign substances such as particles generated in the processing bath float up toward the top portion of the processing bath without being agitated within the processing bath, and are rapidly drained to the outside of the processing bath together with the processing liquid.

It is therefore an object of the present invention to provide an apparatus for and a method of processing a substrate which are capable of suppressing the agitation of a processing liquid within a processing bath to drain foreign substances such as particles out of the processing bath efficiently.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 5 to 9 are views showing modifications of the configuration of the processing bath and the flows of the hydrofluoric acid solution;

FIG. 10 is a vertical sectional view of the substrate processing apparatus taken along a plane parallel to the main surfaces of the substrates according to a second preferred embodiment of the present invention;

FIG. 18 is a view showing an example of a background art substrate processing apparatus.

DESCRIPTION OF THE PREFERRED EMBODIMENTS

Preferred embodiments according to the present invention will now be described with reference to the drawings.

1. First Preferred Embodiment

<1-1. Construction of Substrate Processing Apparatus>

Figure 1:
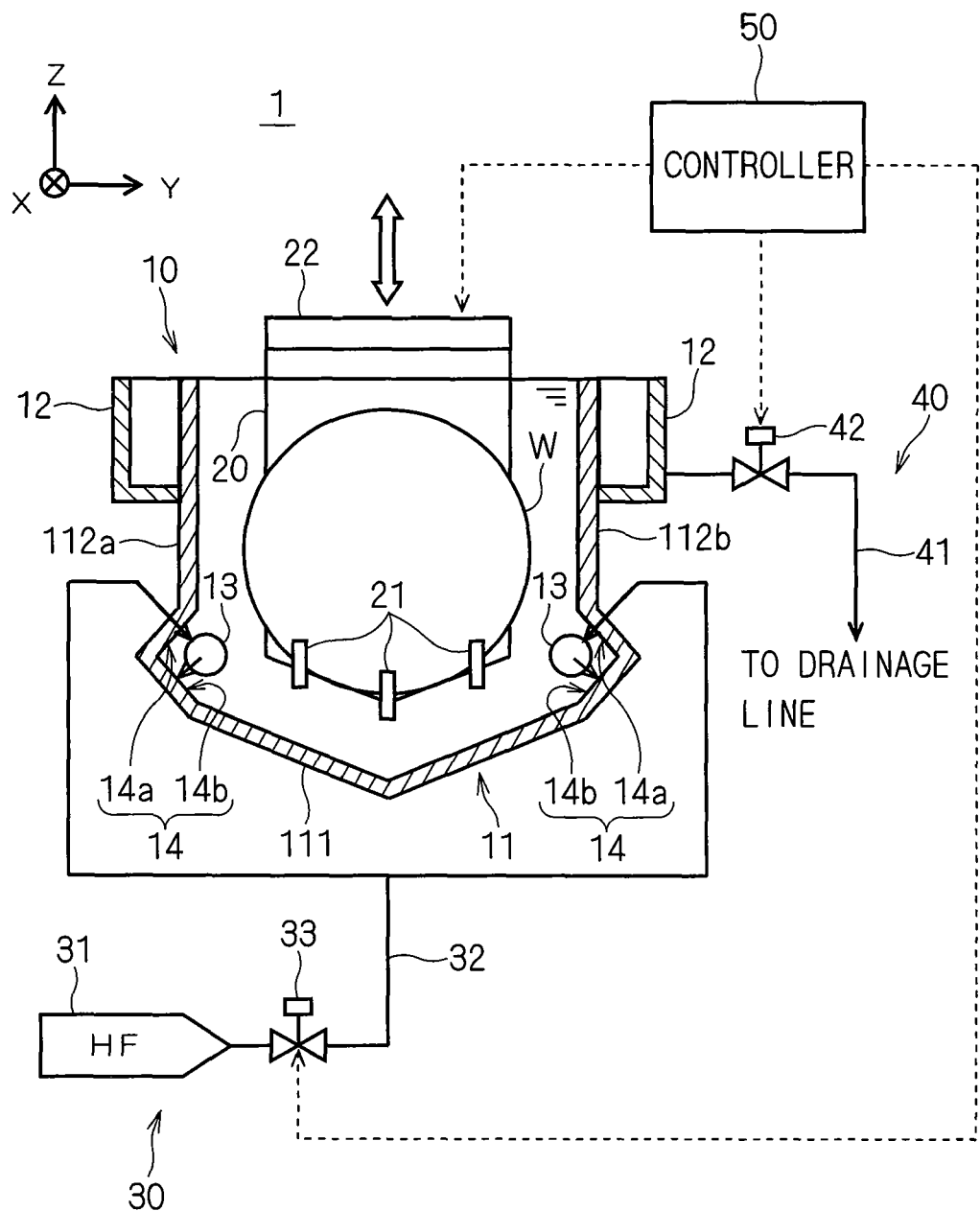
FIG. 1 is a vertical sectional view of a substrate processing apparatus taken along a plane parallel to the main surfaces of substrates according to a first preferred embodiment of the present invention.
Figure 2:
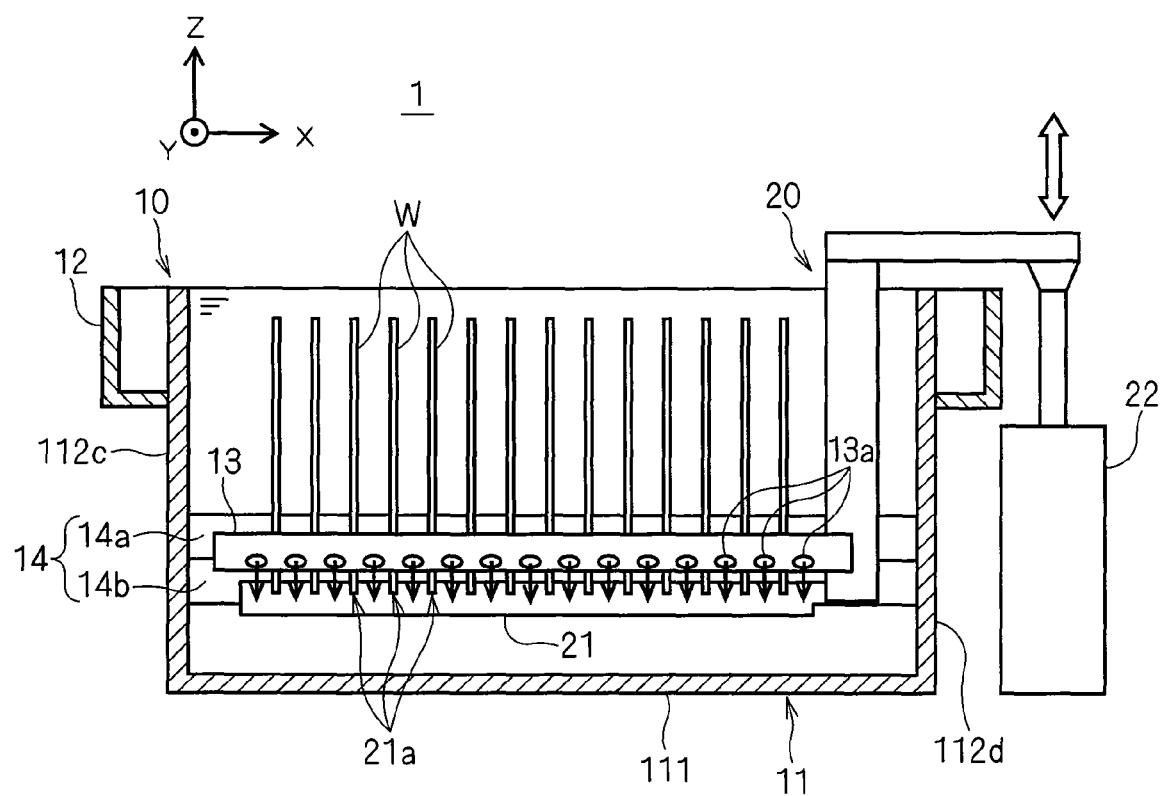
FIG. 2 is a vertical sectional view of the substrate processing apparatus taken along a plane perpendicular to the main surfaces of the substrates according to the first preferred embodiment.

FIG. 1 is a vertical sectional view of a substrate processing apparatus 1 taken along a plane parallel to the main surfaces of substrates W according to a first preferred embodiment of the present invention. The construction of a control system and liquid supply and drainage systems included in the substrate processing apparatus 1 is also shown in FIG. 1. FIG. 2 is a vertical sectional view of the substrate processing apparatus 1 taken along a plane perpendicular to the main surfaces of the substrates W. A common XYZ rectangular coordinate system is additionally shown in FIGS. 1 and 2 for purposes of clarifying the positional relationship between components in the substrate processing apparatus 1.

This substrate processing apparatus 1 is an apparatus which stores a hydrofluoric acid (HF) solution within a processing bath 10 and which performs an etching process on a plurality of substrates W by dipping the substrates W in the stored hydrofluoric acid solution. As shown in FIGS. 1 and 2, the substrate processing apparatus 1 principally includes the processing bath 10 for storing a hydrofluoric acid solution therein, a lifter 20 for transporting substrates W upwardly and downwardly while holding the substrates W, a hydrofluoric acid solution supply part 30 for supplying the hydrofluoric acid solution to the processing bath 10, a hydrofluoric acid solution drainage part 40 for draining the hydrofluoric acid solution from the processing bath 10, and a controller 50 for controlling the operations of the components in the substrate processing apparatus 1.

The processing bath 10 is a reservoir made of a chemical-resistant material such as quartz. The processing bath 10 includes an inner bath 11 which stores the hydrofluoric acid solution therein to dip the substrates W therein, and an outer bath 12 formed in an outer peripheral portion of the inner bath 11. The inner bath 11 includes a bottom wall 111 which is positioned under the substrates W when the substrates W are dipped in the hydrofluoric acid solution, and side walls 112a to 112d positioned lateral to the substrates W. The inner bath 11 has an open top portion. A pair of discharge nozzles 13 for discharging the hydrofluoric acid solution are provided within the inner bath 11. When the hydrofluoric acid solution is discharged from the discharge nozzles 13, the hydrofluoric acid solution is stored within the inner bath 11. The hydrofluoric acid solution stored up to the top portion of the inner bath 11 overflows from the top portion of the inner bath 11 into the outer bath 12.

Of the four side walls 112a to 112d of the inner bath 11, each of the pair of side walls 112a and 112b parallel to a direction in which the substrates W are arranged includes a bottom end portion (a portion in contact with the bottom wall 111) configured to protrude outwardly. Thus, the inner surface of the bottom end portion of each of the side walls 112a and 112b is formed with a groove 14 extending in the direction in which the substrates W are arranged. The groove 14 has an upper tapered surface 14a and a lower tapered surface 14b which collectively form a groove of a V-shaped cross-sectional configuration opening to (or facing toward) the inside of the inner bath 11.

The pair of discharge nozzles 13 are tubular members extending horizontally along the groove 14 formed in each of the side walls 112a and 112b, i.e., in the direction in which the substrates W are arranged. Each of the discharge nozzles 13 is formed with a plurality of discharge openings 13a equally spaced apart from each other. The discharge openings 13a in the discharge nozzles 13 are positioned to correspond to the space between adjacent ones of the substrates W and the outside of the opposite outermost ones of the substrates W within the processing bath 10. The plurality of discharge openings 13a are oriented so that the hydrofluoric acid solution is discharged toward the lower tapered surface 14b of each of the grooves 14. The hydrofluoric acid solution discharged through the plurality of discharge openings 13a impinges at right angles upon the lower tapered surface 14b of each of the grooves 14.

Figure 3:
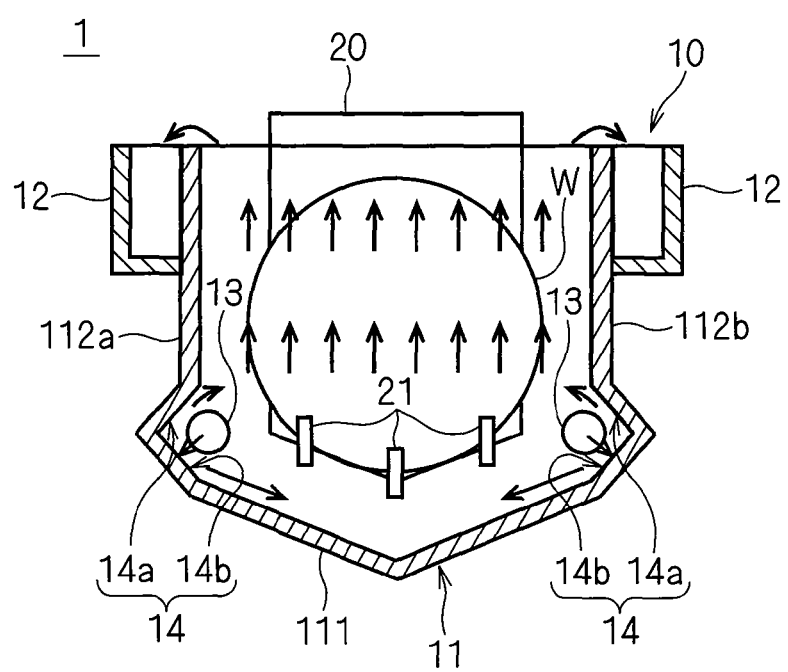
FIG. 3 is a view showing flows of a hydrofluoric acid solution within a processing bath.

FIG. 3 is a view showing flows of hydrofluoric acid solution when the hydrofluoric acid solution is additionally discharged from the discharge nozzles 13, with the processing bath 10 filled with the hydrofluoric acid solution. As shown in FIG. 3, the hydrofluoric acid solution discharged from the discharge nozzles 13 impinges upon the lower tapered surfaces 14b of the respective grooves 14 to turn toward the inside of the inner bath 11 while diffusing along the lower tapered surfaces 14b. The hydrofluoric acid solution diffuses upon impingement upon the lower tapered surfaces 14b to flow at decreasing speeds, and then turns upwardly from near the bottom of the inner bath 11 to move slowly upwardly. In this manner, the grooves 14 formed in the side walls 112a and 112b function as a flow direction controller which directs the flows of hydrofluoric acid solution toward the inside of the inner bath 11, and also function to diffuse the hydrofluoric acid solution to decrease the speed of the flows thereof.

The lifter 20 is a transport mechanism for moving the substrates W upwardly and downwardly between the inside of the processing bath 10 and a position over the processing bath 10 while holding the substrates W. The lifter 20 includes three holding rods 21 extending in the direction in which the substrates W are arranged, and each of the holding rods 21 is formed with a plurality of holding grooves 21a. The substrates W are held in parallel with each other in an upright position on the three holding rods 21, with peripheral portions of the respective substrates W fitted in the holding grooves 21a. The lifter 20 is connected to a driver 22 constructed by a known mechanism including a motor, a ball screw and the like combined together. When the driver 22 is operated, the lifter 20 moves upwardly and downwardly to transport the substrates W between a dipped position (the position of the substrates W shown in FIG. 1) which is inside the processing bath 10 and a raised position which is over the processing bath 10.

The hydrofluoric acid solution supply part 30 is a piping system for supplying the hydrofluoric acid solution serving as a processing liquid to the above-mentioned discharge nozzles 13. As shown in FIG. 1, the hydrofluoric acid solution supply part 30 includes a hydrofluoric acid solution supply source 31, a pipe 32, and an on-off valve 33. The pipe 32 has an upstream end connected to the hydrofluoric acid solution supply source 31, and the on-off valve 33 is interposed in the pipe 32. The pipe 32 is divided at its downstream end into two branch pipes which in turn are connected to the pair of discharge nozzles 13, respectively. Thus, when the on-off valve 33 is opened, the hydrofluoric acid solution is supplied from the hydrofluoric acid solution supply source 31 through the pipe 32 to the pair of discharge nozzles 13, and is then discharged through the plurality of discharge openings 13a of each of the discharge nozzles 13 into the inner bath 11.

The hydrofluoric acid solution drainage part 40 is a piping system for collecting the hydrofluoric acid solution from the outer bath 12 to drain the collected hydrofluoric acid solution to a drainage line. As shown in FIG. 1, the hydrofluoric acid solution drainage part 40 includes a pipe 41 and an on-off valve 42. The pipe 41 has an upstream end connected to the outer bath 12, and a downstream end connected to the drainage line in a factory. The on-off valve 42 is interposed in the pipe 41. Thus, when the on-off valve 42 is opened, the hydrofluoric acid solution is drained from the outer bath 12 through the pipe 41 to the drainage line.

The controller 50 is a computer device for controlling the operations of the components of the substrate processing apparatus 1. The controller 50 is electrically connected to the driver 22, the on-off valve 33 and the on-off valve 42 described above. The controller 50 brings the driver 22, the on-off valve 33 and the on-off valve 42 described above into operation in accordance with a preinstalled program and various command entries to cause the processing of the substrates W to proceed.

<1-2. Operation of Substrate Processing Apparatus>

Figure 4:
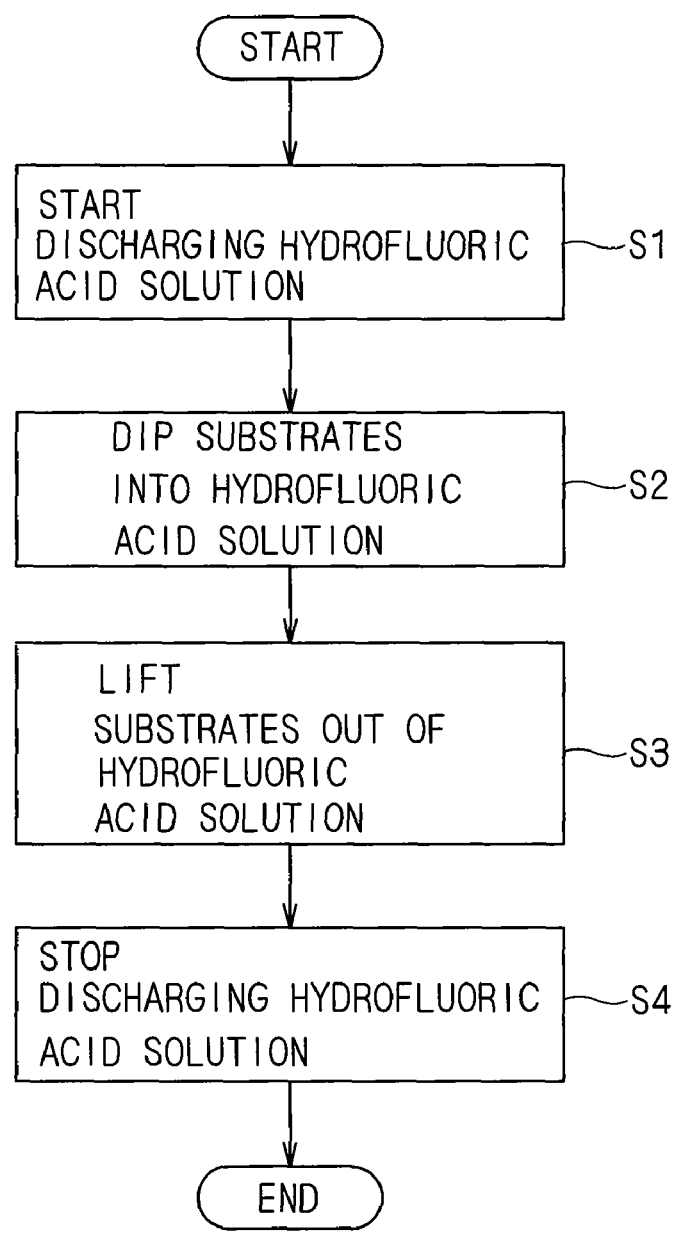
FIG. 4 is a flow diagram showing the operation of the substrate processing apparatus.

Next, the operation of the above-mentioned substrate processing apparatus 1 for the processing of a set of substrates W will be described with reference to the flow diagram of FIG. 4. For the processing of the substrates W in the substrate processing apparatus 1, the first step is to open the on-off valve 33 and the on-off valve 42. This supplies the hydrofluoric acid solution from the hydrofluoric acid solution supply source 31 through the pipe 32 to the discharge nozzles 13 to discharge the hydrofluoric acid solution from the discharge nozzles 13 into the inner bath 11 (in Step S1). The hydrofluoric acid solution discharged from the discharge nozzles 13 is gradually stored within the inner bath 11, and overflows from the top portion of the inner bath 11 into the outer bath 12 in due course.

Next, the substrates W transported from another apparatus by a predetermined transport mechanism are placed onto the lifter 20 waiting in the position over the processing bath 10. After the substrates W are placed on the lifter 20, the substrate processing apparatus 1 brings the driver 22 into operation to move the lifter 20 downwardly, thereby dipping the substrates W into the hydrofluoric acid solution stored within the processing bath 10 (in Step S2). When the substrates W are dipped in the hydrofluoric acid solution, the substrates W are subjected to an etching process by a hydrofluoric acid component in the hydrofluoric acid solution.

At this time, flows of hydrofluoric acid solution generally shown in FIG. 3 are formed within the processing bath 10. Specifically, the hydrofluoric acid solution discharged from the discharge nozzles 13 impinges upon the lower tapered surfaces 14b of the respective grooves 14 to turn toward the substrates W along the lower tapered surfaces 14b while diffusing and flowing at decreasing speeds. Then, the hydrofluoric acid solution the flows of which are joined together near a central bottom portion of the inner bath 11 moves slowly upwardly from near the bottom portion of the inner bath 11 to form liquid flows directed uniformly upwardly at a low speed around the substrates W.

As the etching process proceeds, a metal component dissolves from the surfaces of the substrates W into the hydrofluoric acid solution, and foreign substances such as particles and the like deposited on the surfaces of the substrates W are lifted off (or released from) the surfaces of the substrates W into the hydrofluoric acid solution. However, the liquid flows directed uniformly upwardly at a low speed are formed around the substrates W as mentioned above. Thus, the metal component and foreign substances contained in the hydrofluoric acid solution float up toward the top portion of the inner bath 11 without being agitated within the inner bath 11, and are rapidly drained to the outer bath 12 together with the hydrofluoric acid solution. This prevents the metal component and foreign substances generated in the hydrofluoric acid solution from adhering to the surfaces of the substrates W again.

After the etching process for a predetermined time period, the substrate processing apparatus 1 brings the driver 22 into operation to move the lifter 20 upwardly, thereby lifting the substrates W out of the hydrofluoric acid solution stored within the inner bath 11 (in Step S3). Thereafter, the substrates W are transferred from the lifter 20 to a predetermined transport device, and are then transported to an apparatus for performing the subsequent process by the predetermined transport device. The substrate processing apparatus 1 closes the on-off valve 33 and the on-off valve 42. This stops the discharge of the hydrofluoric acid solution from the discharge nozzles 13 and the drainage of the hydrofluoric acid solution to the hydrofluoric acid solution drainage part 40 (in Step S4). Thus, a series of processes of the set of substrates W are completed.

In this manner, the substrate processing apparatus 1 according to the first preferred embodiment discharges the hydrofluoric acid solution from the discharge nozzles 13 toward the grooves 14 formed in the side walls 112a and 112b of the inner bath 11. The hydrofluoric acid solution discharged from the discharge nozzles 13 impinges upon the grooves 14 to diffuse, thereby moving toward the top portion of the inner bath 11 in the form of low-speed uniform liquid flows. Thus, the metal component and foreign substances generated in the inner bath 11 float up toward the top portion of the inner bath 11 without being agitated within the inner bath 11, and are rapidly drained to the outer bath 12 together with the hydrofluoric acid solution.

The substrate processing apparatus 1 according to the first preferred embodiment forms the low-speed uniform flows of hydrofluoric acid solution within the inner bath 11 to accomplish the efficient drainage of the hydrofluoric acid solution out of the inner bath 11 and the efficient supply of a new hydrofluoric acid solution into the inner bath 11. In other words, the substrate processing apparatus 1 is capable of efficiently replacing the used hydrofluoric acid solution within the inner bath 11 with a new hydrofluoric acid solution during the etching process to apply a constantly clean hydrofluoric acid solution to the substrates W. This reduces the time required for the etching process.

If the diameter of the discharge openings 13a of the discharge nozzles 13 is increased, there arises a significant difference in discharge pressure of the hydrofluoric acid solution between upstream ones of the discharge openings 13a and downstream ones of the discharge openings 13a. The substrate processing apparatus 1 according to the first preferred embodiment, however, does not decrease the speed of the flows of hydrofluoric acid solution by increasing the diameter of the discharge openings 13a but decreases the speed of the flows of hydrofluoric acid solution by causing the hydrofluoric acid solution to impinge upon the side walls 112a and 112b of the inner bath 11. This achieves the decrease in the speed of the flows of hydrofluoric acid solution while preventing the significant difference in discharge pressure of the hydrofluoric acid solution between upstream ones of the discharge openings 13a and downstream ones of the discharge openings 13a.

Further, the substrate processing apparatus 1 according to the first preferred embodiment achieves the decrease in the speed of the flows of hydrofluoric acid solution without complicating the construction of the discharge nozzles 13 themselves. This improves the replacement efficiency of the hydrofluoric acid solution while suppressing the increase in manufacturing costs of the substrate processing apparatus 1 including the discharge nozzles 13.

According to the first preferred embodiment, the discharge nozzles 13 discharge the hydrofluoric acid solution toward the lower tapered surfaces 14b of the grooves 14 formed in the side walls 112a and 112b of the inner bath 11. This allows a greater amount of diffused hydrofluoric acid solution to move toward the vicinity of the bottom portion of the inner bath 11, thereby further improving the replacement efficiency of the hydrofluoric acid solution.

<1-3. Modifications>

Although the discharge nozzles 13 according to the first preferred embodiment described above discharge the hydrofluoric acid solution toward the lower tapered surfaces 14b of the grooves 14, the discharge nozzles 13 may discharge the hydrofluoric acid solution toward other portions of the grooves 14. As shown in FIG. 5, for example, the hydrofluoric acid solution may be discharged from the discharge nozzles 13 toward a boundary between the upper and lower tapered surfaces 14a and 14b.

Figure 7:
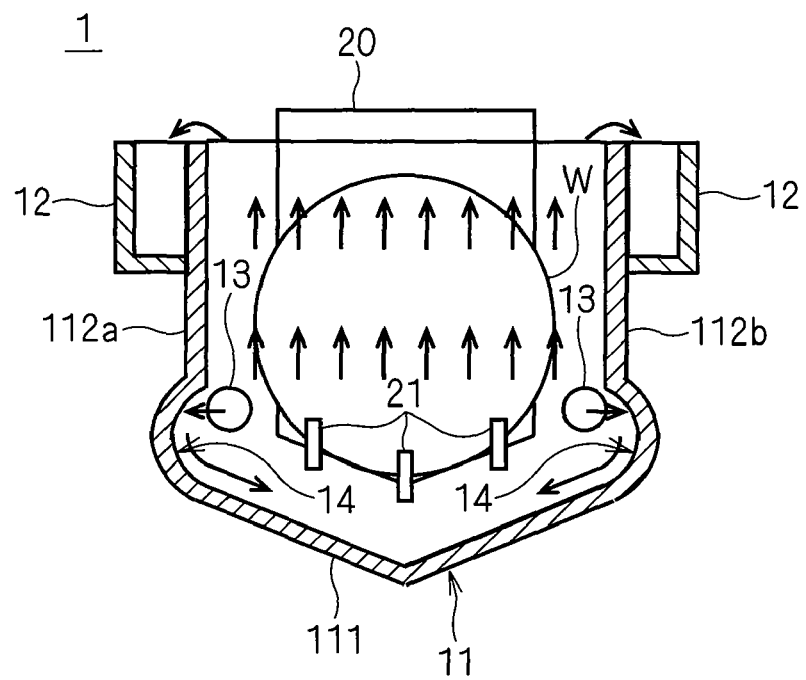

Each of the grooves 14 according to the first preferred embodiment described above is a groove of a V-shaped cross-sectional configuration defined by the pair of tapered surfaces 14a and 14b. The configuration of the grooves 14 may be a curved surface (semicylindrical) as shown in FIGS. 6 and 7. It is only necessary that a recessed portion having a configuration for the flow direction control of the discharged hydrofluoric acid solution be formed in a position opposed to the plurality of discharge openings 13a of the discharge nozzles 13. When the configuration of the grooves 14 is a curved surface, the discharge nozzles 13 may be disposed slightly above the central axis of each of the grooves 14 to discharge the hydrofluoric acid solution toward an upper portion of each of the grooves 14, as shown in FIG. 7. This allows the hydrofluoric acid solution discharged from the discharge nozzles 13 to move along the curved surface of each of the grooves 14 to the vicinity of the bottom portion, thereby forming the flows of hydrofluoric acid solution directed upwardly from the bottom portion of the inner bath 11 well.

Figure 8:
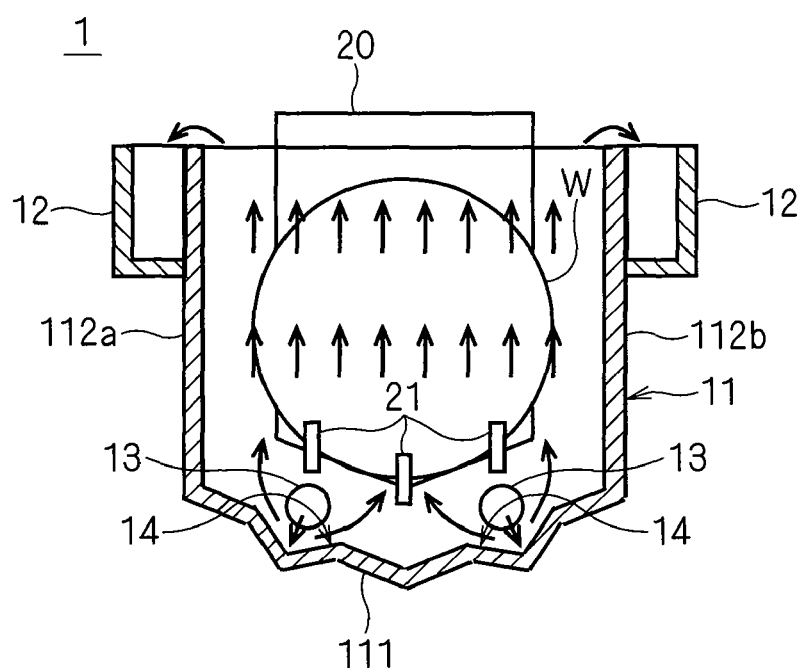

Although the grooves 14 are formed in the bottom end portions of the side walls 112a and 112b, respectively, of the inner bath 11 according to the first preferred embodiment described above, the grooves 14 may be formed in a position slightly shifted toward upper portions of the side walls 112a and 112b. Alternatively, the grooves 14 may be formed in the bottom wall 111 of the inner bath 11, as shown in FIG. 8.

The substrate processing apparatus according to the present invention may be designed such that the hydrofluoric acid solution is discharged from the discharge nozzles 13 toward the inner surface of the inner bath 11 in which the grooves 14 are dispensed with. As shown in FIG. 9, for example, the hydrofluoric acid solution may be discharged from the discharge nozzles 13 toward the side walls 112a and 112b of the inner bath 11. The substrate processing apparatus 1 of such a configuration is capable of diffusing the hydrofluoric acid solution to decrease the speed of the flows thereof, thereby forming the low-speed flows of hydrofluoric acid solution around the substrates W. When the hydrofluoric acid solution is discharged toward the side walls 112a and 112b, it is desirable that the hydrofluoric acid solution is directed at right angles toward the side walls 112a and 112b, as shown in FIG. 9. This prevents the hydrofluoric acid solution (the hydrofluoric acid solution containing the metal component and foreign substances) near the top portion of the inner bath 11 from being carried in the discharged liquid flows toward the bottom portion of the inner bath 11.

Although the hydrofluoric acid solution is used as the processing liquid according to the first preferred embodiment described above, the substrate processing apparatus according to the present invention may use other processing liquids to process the substrates W. Examples of the processing liquid used herein may include an SC-1 (standard cleaning 1; $NH_4OH$—$H_2O_2$—$H_2O$) solution, an SC-2 (standard cleaning 2; HCl—$H_2O_2$—$H_2O$) solution, Caro's acid, deionized water and the like. The present invention is applicable not only to a substrate processing apparatus which processes semiconductor substrates but also to substrate processing apparatuses which process various substrates such as glass substrates for a liquid crystal display device, glass substrates for a photomask and the like.

2. Second Preferred Embodiment

<2-1. Construction of Substrate Processing Apparatus>

Figure 11:
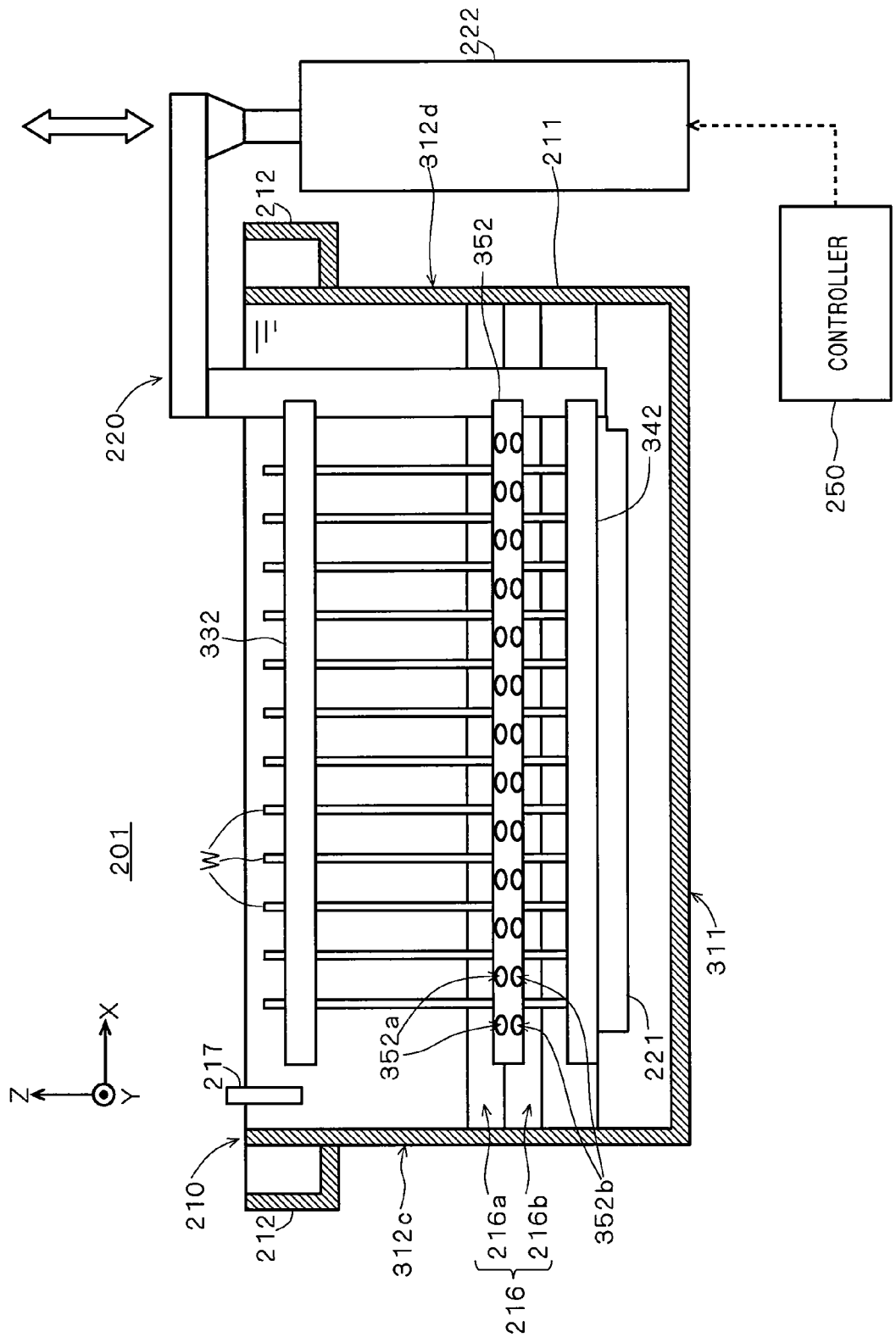
FIG. 11 is a vertical sectional view of the substrate processing apparatus taken along a plane perpendicular to the main surfaces of the substrates according to the second preferred embodiment.
Figure 12:
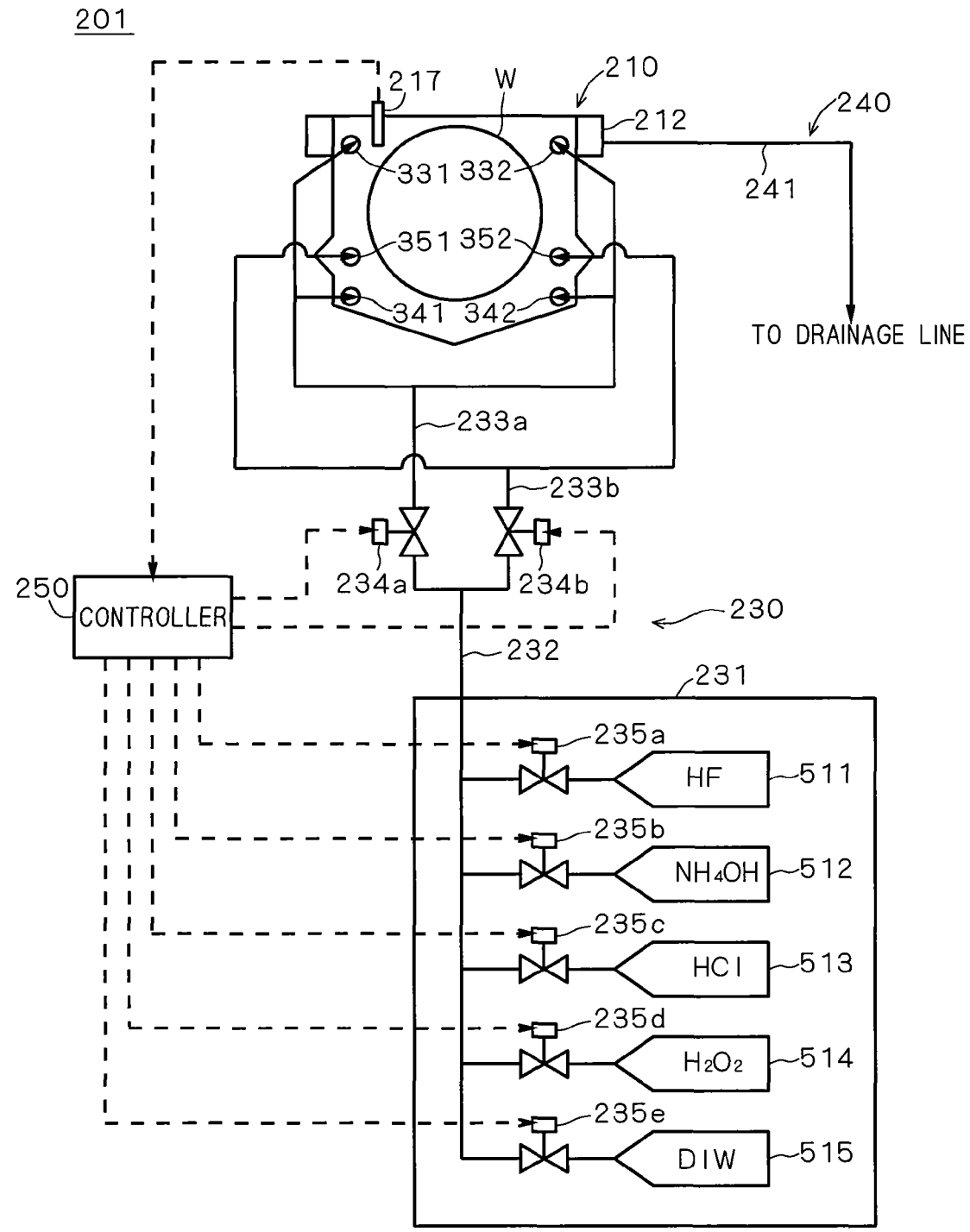
FIG. 12 shows the construction of a control system and liquid supply and drainage systems for the substrate processing apparatus.

FIG. 10 is a vertical sectional view of a substrate processing apparatus 201 taken along a plane parallel to the main surfaces of substrates W according to a second preferred embodiment of the present invention. FIG. 11 is a vertical sectional view of the substrate processing apparatus 201 taken along a plane perpendicular to the main surfaces of the substrate W. A common XYZ rectangular coordinate system is additionally shown in FIGS. 10 and 11 for purposes of clarifying the positional relationship between components in the substrate processing apparatus 201. FIG. 12 shows the construction of a control system and liquid supply and drainage systems for the substrate processing apparatus 201. The construction of the substrate processing apparatus 201 will be described below with reference to FIGS. 10 to 12.

This substrate processing apparatus 201 is an apparatus which stores deionized water, dilute hydrofluoric acid, deionized water, the SC-1 solution, deionized water, the SC-2 solution, and deionized water (these liquids and a mixture of these liquids are collectively referred to as a "processing liquid" hereinafter) in the order named within a processing bath 210, and which performs a cleaning process, an etching process and the like on a plurality of substrates W by dipping the substrates W in the processing liquid. As shown in FIGS. 10 to 12, the substrate processing apparatus 201 principally includes the processing bath 210 for storing the processing liquid therein, a lifter 220 for transporting substrates W upwardly and downwardly while holding the substrates W, a processing liquid supply part 230 for supplying the processing liquid to the processing bath 210, a processing liquid drainage part 240 for draining the processing liquid from the processing bath 210, and a controller 250 for controlling the operations of components in the substrate processing apparatus 201.

The processing bath 210 is a reservoir made of quartz or a chemical-resistant resin. The processing bath 210 includes an inner bath 211 which stores the processing liquid therein to dip the substrates W therein, and an outer bath 212 formed in an outer peripheral portion of the inner bath 211. The inner bath 211 includes a bottom wall 311 which is positioned under the substrates W when the substrates W are dipped in the processing liquid, and side walls 312a to 312d positioned lateral to the substrates W. The inner bath 211 has an open top portion.

Four discharge nozzles 331, 332, 341 and 342 for discharging the processing liquid toward the inside of the inner bath 211 and two discharge nozzles 351 and 352 for discharging the processing liquid toward the side walls 312a and 312b of the inner bath 211 are provided within the inner bath 211. The discharge nozzles 331, 332, 341, 342, 351 and 352 are hollow tubular members extending horizontally in the direction in which the substrates W are arranged. Each of the discharge nozzles 331, 332, 341, 342, 351 and 352 is formed with a plurality of discharge openings equally spaced apart from each other depending on the discharge direction thereof.

The discharge nozzles 331 and 332 are disposed near the top portion of the inner bath 211 (at a position higher than the center of the substrates W dipped in the processing liquid), and are fixed horizontally along the pair of side walls 312a and 312b opposed to each other with the substrates W therebetween. The discharge nozzles 331 and 332 are formed with a plurality of discharge openings 331a and 332a which discharge the processing liquid slightly downwardly toward the inside of the inner bath 211. The positions of the plurality of discharge openings 331a and 332a along the X-axis correspond to the space between adjacent ones of the substrates W and the outside of the opposite outermost ones of the substrates W within the processing bath 210. When the processing liquid is supplied to the discharge nozzles 331 and 332, the processing liquid is discharged through the plurality of discharge openings 331a and 332a of the discharge nozzles 331 and 332 toward the dipped position of the substrates W within the inner bath 211.

The discharge nozzles 341 and 342 are disposed near the bottom portion of the inner bath 211 (at a position lower than the center of the substrates W dipped in the processing liquid), and are fixed horizontally along the pair of side walls 312a and 312b opposed to each other with the substrates W therebetween. The discharge nozzles 341 and 342 are formed with a plurality of discharge openings 341a and 342a which discharge the processing liquid slightly upwardly toward the inside of the inner bath 211 and a plurality of discharge openings 341b and 342b which discharge the processing liquid along the bottom wall 311 toward the inside of the inner bath 211. The positions of the plurality of discharge openings 341a, 341b, 342a and 342b along the X-axis correspond to the space between adjacent ones of the substrates W and the outside of the opposite outermost ones of the substrates W within the processing bath 210. When the processing liquid is supplied to the discharge nozzles 341 and 342, the processing liquid is discharged through the plurality of discharge openings 341a and 342a of the discharge nozzles 341 and 342 toward the dipped position of the substrates W within the inner bath 211, and is discharged through the plurality of discharge openings 341b and 342b of the discharge nozzles 341 and 342 toward the central position of the bottom portion of the inner bath 211.

The discharge nozzles 351 and 352 are disposed above the discharge nozzles 341 and 342 near the bottom portion of the inner bath 211, and are fixed horizontally along the pair of side walls 312a and 312b opposed to each other with the substrates W therebetween. The discharge nozzles 351 and 352 are formed with a plurality of discharge openings 351a, 351b, 352a and 352b which discharge the processing liquid toward grooves 216 formed respectively in the pair of side walls 312a and 312b. Each of the grooves 216 has an upper tapered surface 216a and a lower tapered surface 216b which collectively form a groove of a V-shaped cross-sectional configuration opening to (or facing toward) the inside of the inner bath 211. The discharge openings 351a and the discharge openings 352a are oriented toward the upper tapered surfaces 216a of the respective grooves 216, and the discharge openings 351b and the discharge openings 352b are oriented toward the lower tapered surfaces 216b of the respective grooves 216. The positions of the plurality of discharge openings 351a, 351b, 352a and 352b along the X-axis correspond to the space between adjacent ones of the substrates W and the outside of the opposite outermost ones of the substrates W within the processing bath 210. When the processing liquid is supplied to the discharge nozzles 351 and 352, the processing liquid is discharged through the plurality of discharge openings 351a and 352a of the discharge nozzles 351 and 352 toward the upper tapered surfaces 216a of the respective grooves 216, and is discharged through the plurality of discharge openings 351b and 352b of the discharge nozzles 351 and 352 toward the lower tapered surfaces 216b of the respective grooves 216.

The processing liquid discharged from the discharge nozzles 351 and 352 impinges upon the upper and lower tapered surfaces 216a and 216b of the grooves 216 to turn toward the inside of the inner bath 211 while diffusing along the upper and lower tapered surfaces 216a and 216b. The diffused processing liquid forms wide low-speed liquid flows which in turn reach the central position of the bottom portion of the inner bath 211 and further turn toward the top portion of the inner bath 211 to move slowly upwardly. In this manner, the grooves 216 formed in the side walls 312a and 312b function as a flow direction controller which directs the flows of processing liquid discharged from the discharge nozzles 351 and 352 toward the inside of the inner bath 211, and also function to diffuse the processing liquid discharged from the discharge nozzles 351 and 352 to decrease the speed of the flows thereof.

The substrate processing apparatus 201 discharges the processing liquid from the discharge nozzles 331, 332, 341, 342, 351 and 352 toward the inside of the inner bath 211 to store the processing liquid within the inner bath 211. The processing liquid stored up to the top portion of the inner bath 211 overflows from the top portion of the inner bath 211 into the outer bath 212.

A resistivity meter 217 for measuring the resistivity value of the processing liquid is provided within the inner bath 211. The resistivity meter 217 includes a pair of metal electrodes, and measures an electrical resistance between the metal electrodes to measure the resistivity value of the processing liquid. During the process of replacing the processing liquid to be described later, the resistivity meter 217 measures the resistivity value of the processing liquid stored within the processing bath 210 to send information about the obtained resistivity value to the controller 250. The resistivity meter 217 may incorporate a temperature sensor in the metal electrodes to send an equivalent of the resistivity value at a predetermined temperature to the controller 250.

The lifter 220 is a transport mechanism for moving the substrates W upwardly and downwardly between the inside of the inner bath 211 and a position over the processing bath 210 while holding the substrates W. The lifter 220 includes three holding rods 221 extending in the direction in which the substrates W are arranged, and each of the holding rods 221 is formed with a plurality of holding grooves 221a. The substrates W are held in parallel with each other in an upright position on the three holding rods 221, with peripheral portions of the respective substrates W fitted in the holding grooves 221a. The lifter 220 is connected to a driver 222 constructed by a known mechanism including a motor, a ball screw and the like combined together. When the driver 222 is operated, the lifter 220 moves upwardly and downwardly to transport the substrates W between the dipped position (the position of the substrates W shown in FIGS. 10 and 11) which is inside the inner bath 211 and the raised position which is over the processing bath 210.

The processing liquid supply part 230 is a piping system for supplying the processing liquid to the above-mentioned discharge nozzles 331, 332, 341, 342, 351 and 352. As shown in FIG. 12, the processing liquid supply part 230 includes a processing liquid supply source 231, a main pipe 232, branch pipes 233a and 233b, and on-off valves 234a and 234b.

The processing liquid supply source 231 includes a hydrofluoric acid supply source 511, an ammonium hydroxide supply source 512, a hydrochloric acid supply source 513, a hydrogen peroxide supply source 514, and a deionized water supply source 515. The hydrofluoric acid supply source 511, the ammonium hydroxide supply source 512, the hydrochloric acid supply source 513, the hydrogen peroxide supply source 514, and the deionized water supply source 515 are fluidly connected to the main pipe 232 through on-off valves 235a, 235b, 235c, 235d and 235e, respectively. The main pipe 232 has a downstream end connected the branch pipes 233a and 233b. The on-off valves 234a and 234b are interposed in the branch pipes 233a and 233b, respectively. The branch pipe 233a is divided at its downstream end into four sub-branch pipes which in turn are connected to the discharge nozzles 331, 332, 341 and 342, respectively. The branch pipe 233b is divided at its downstream end into two sub-branch pipes which in turn are connected to the discharge nozzles 351 and 352, respectively.

When the on-off valves 235b, 235c and 235d are closed and the on-off valves 235a and 235e are opened in the processing liquid supply source 231, hydrofluoric acid from the hydrofluoric acid supply source 511 and deionized water from the deionized water supply source 515 are mixed together in predetermined proportions to form dilute hydrofluoric acid. The generated dilute hydrofluoric acid is supplied to the main pipe 232. The dilute hydrofluoric acid functions as an etchant for the execution of an etching process on substrates W.

When the on-off valves 235a and 235c are closed and the on-off valves 235b, 235d and 235e are opened in the processing liquid supply source 231, ammonium hydroxide from the ammonium hydroxide supply source 512, hydrogen peroxide from the hydrogen peroxide supply source 514, and deionized water from the deionized water supply source 515 are mixed together in predetermined proportions to form the SC-1 solution. The generated SC-1 solution is supplied to the main pipe 232. The SC-1 solution functions as a cleaning liquid for the execution of a liquid chemical cleaning process (a non-etching process) on substrates W.

When the on-off valves 235a and 235b are closed and the on-off valves 235c, 235d and 235e are opened in the processing liquid supply source 231, hydrochloric acid from the hydrochloric acid supply source 513, hydrogen peroxide from the hydrogen peroxide supply source 514, and deionized water from the deionized water supply source 515 are mixed together in predetermined proportions to form the SC-2 solution. The generated SC-2 solution is supplied to the main pipe 232. The SC-2 solution functions as a cleaning liquid for the execution of a liquid chemical cleaning process (a non-etching process) on substrates W.

When the on-off valves 235a, 235b, 235c and 235d are closed and the on-off valve 235e is opened in the processing liquid supply source 231, only deionized water from the deionized water supply source 515 is supplied to the main pipe 232.

In this manner, the dilute hydrofluoric acid, SC-1 solution, SC-2 solution or deionized water supplied from the processing liquid supply source 231 is supplied to the branch pipe 233a or the branch pipe 233b by changing the on-off valves 234a and 234b between the "on" and "off" states. Specifically, when the on-off valve 234b is closed and the on-off valve 234a is opened, the dilute hydrofluoric acid, SC-1 solution, SC-2 solution or deionized water supplied from the processing liquid supply source 231 is fed through the branch pipe 233a to the discharge nozzles 331, 332, 341 and 342, and is discharged through the plurality of discharge openings 331a, 332a, 341a, 341b, 342a and 342b of the discharge nozzles 331, 332, 341 and 342 into the inner bath 211. When the on-off valve 234a is closed and the on-off valve 234b is opened, the dilute hydrofluoric acid, SC-1 solution, SC-2 solution or deionized water supplied from the processing liquid supply source 231 is fed through the branch pipe 233b to the discharge nozzles 351 and 352, and is discharged through the plurality of discharge openings 351a, 351b, 352a and 352b of the discharge nozzles 351 and 352 into the inner bath 211.

The processing liquid drainage part 240 is a piping system for collecting the processing liquid from the outer bath 212 to drain the collected processing liquid to a drainage line. As shown in FIG. 12, the processing liquid drainage part 240 includes a pipe 241. The pipe 241 has an upstream end connected to the outer bath 212, and a downstream end connected to the drainage line in a factory. Thus, the processing liquid overflowing into the outer bath 212 is drained from the outer bath 212 through the pipe 241 to the drainage line.

The controller 250 is a computer device for controlling the operations of the components of the substrate processing apparatus 201. The controller 250 is electrically connected to the resistivity meter 217, the driver 222, and the on-off valves 234a, 234b, 235a, 235b, 235c, 235d and 235e described above. The controller 250 receives the measurement value from the resistivity meter 217 to control the operations of the driver 222 and the on-off valves 234a, 234b, 235a, 235b, 235c, 235d and 235e described above in accordance with the above-mentioned measurement value and a preinstalled program, thereby causing the processing of the substrates W to proceed.

<2-2. Operation of Substrate Processing Apparatus>

Figure 13:
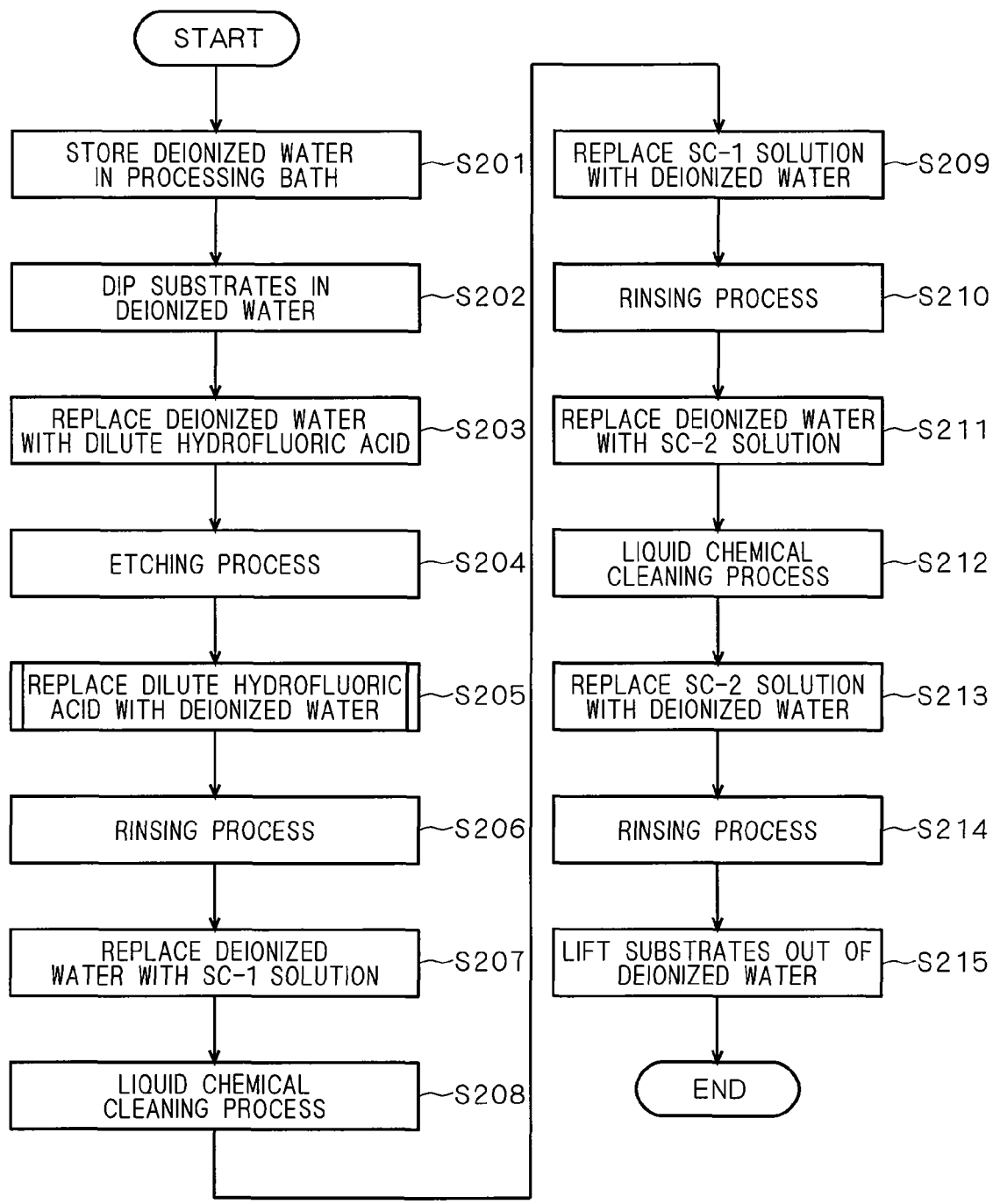
FIG. 13 is a flow diagram showing a procedure for the operation of the substrate processing apparatus.

Next, the operation of the above-mentioned substrate processing apparatus 201 for the processing of a set of substrates W will be described with reference to the flow diagram of FIG. 13.

For the processing of the substrates W in the substrate processing apparatus 201, the first step is to supply deionized water from the processing liquid supply source 231, with the on-off valve 234a closed and the on-off valve 234b open. The deionized water supplied from the processing liquid supply source 231 flows through the main pipe 232 and the branch pipe 233b into the discharge nozzles 351 and 352, and is then discharged from the discharge nozzles 351 and 352 into the inner bath 211. Thus, the deionized water is stored gradually within the inner bath 211, and overflows from the top portion of the inner bath 211 into the outer bath 212 in due course (in Step S201). The deionized water overflowing into the outer bath 212 is drained through the pipe 241 to the drainage line.

Next, the substrates W transported from another apparatus by a predetermined transport mechanism are placed onto the lifter 220 waiting in the position over the processing bath 210. After the substrates W are placed on the lifter 220, the substrate processing apparatus 201 brings the driver 222 into operation to move the lifter 220 downwardly, thereby dipping the substrates W into the deionized water stored within the inner bath 211 (in Step S202).

Subsequently, the substrate processing apparatus 201 closes the on-off valve 234b, and opens the on-off valve 234a. Then, dilute hydrofluoric acid is supplied from the processing liquid supply source 231 in place of deionized water. The dilute hydrofluoric acid supplied from the processing liquid supply source 231 flows through the main pipe 232 and the branch pipe 233a into the discharge nozzles 331, 332, 341 and 342, and is then discharged from the discharge nozzles 331, 332, 341 and 342 into the inner bath 211. The substrate processing apparatus 201 causes the processing liquid to overflow from the top portion of the inner bath 211 into the outer bath 212 while supplying the dilute hydrofluoric acid into the inner bath 211, thereby gradually replacing the deionized water with the dilute hydrofluoric acid within the inner bath 211 (in Step S203).

Figure 15:
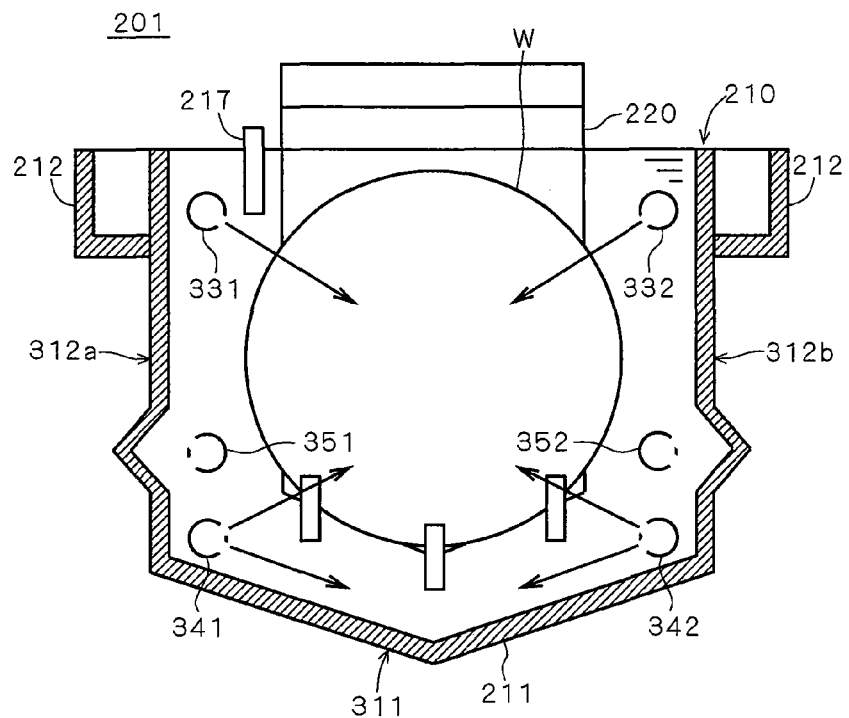
FIG. 15 is a view showing that a processing liquid is discharged from discharge nozzles toward the inside of an inner bath.

When the replacement of the deionized water with the dilute hydrofluoric acid starts, the etching process of the substrates W is started by a hydrofluoric acid component supplied to near the main surfaces of the substrates W. The dilute hydrofluoric acid is discharged from the discharge nozzles 331, 332, 341 and 342 toward the inside of the inner bath 211 to form relatively high-speed liquid flows within the inner bath 211, as shown in FIG. 15. This causes the hydrofluoric acid component supplied to the inside of the inner bath 211 to be agitated widely all over the inside of the inner bath 211. Thus, in the source of the replacement of the deionized water with the dilute hydrofluoric acid, the concentration of the hydrofluoric acid component is always made uniform within the inner bath 211, and the uniform etching process is performed on the entire major surfaces of the substrates W.

After the completion of the replacement of the deionized water with the dilute hydrofluoric acid, the substrate processing apparatus 201 continues the discharge of the dilute hydrofluoric acid from the discharge nozzles 331, 332, 341 and 342 as required. The substrates W dipped in the dilute hydrofluoric acid stored in the inner bath 211 continue to be subjected to the etching process (in Step S204).

Figure 14:
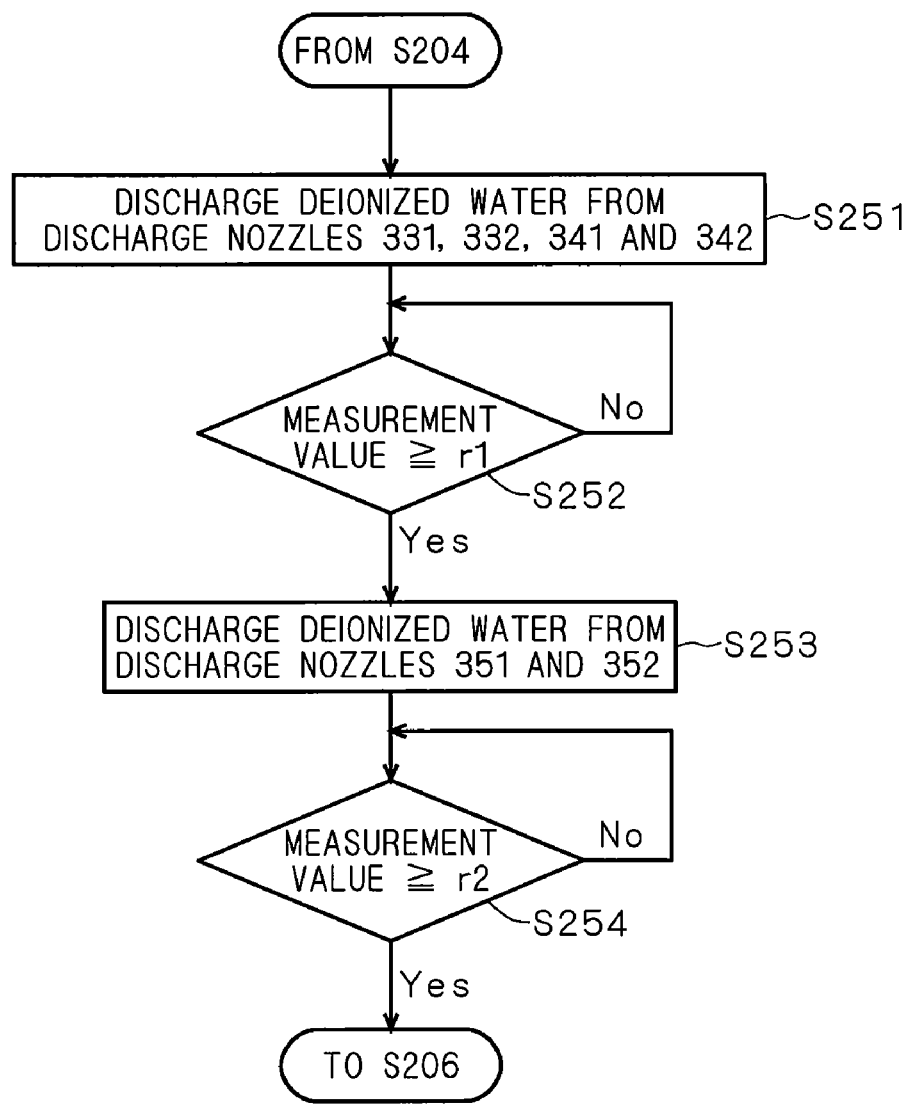
FIG. 14 is a flow diagram showing a procedure for the process of replacing dilute hydrofluoric acid with deionized water.

Next, the substrate processing apparatus 201 replaces the dilute hydrofluoric acid with deionized water within the inner bath 211 (in step S205). A detailed procedure for the process of replacing the dilute hydrofluoric acid with the deionized water in Step S205 will be described with reference to FIG. 14.

For the replacement of the dilute hydrofluoric acid with the deionized water within the inner bath 211, the substrate processing apparatus 201 initially supplies deionized water from the processing liquid supply source 231, with the on-off valve 234b maintained closed and the on-off valve 234a maintained open. The deionized water supplied from the processing liquid supply source 231 flows through the main pipe 232 and the branch pipe 233a into the discharge nozzles 331, 332, 341 and 342, and is then discharged from the discharge nozzles 331, 332, 341 and 342 into the inner bath 211 (in Step S251). The substrate processing apparatus 201 causes the processing liquid to overflow from the top portion of the inner bath 211 into the outer bath 212 while supplying the deionized water into the inner bath 211, thereby gradually replacing the dilute hydrofluoric acid with the deionized water within the inner bath 211.

In the early stage of the replacement of the dilute hydrofluoric acid with the deionized water, the hydrofluoric acid component remaining within the inner bath 211 causes the etching process of the substrates W to still proceed. In this early stage of the replacement, the substrate processing apparatus 201 discharges the deionized water from the discharge nozzles 331, 332, 341 and 342 to flow relatively high-speed liquid flows within the inner bath 211, as shown in FIG. 15. This causes the hydrofluoric acid component remaining within the inner bath 211 to be agitated widely all over the inside of the inner bath 211, thereby accomplishing the uniform etching process on the entire surfaces of the substrates W.

As the replacement of the dilute hydrofluoric acid with the deionized water proceeds, the concentration of the hydrofluoric acid component in the processing liquid stored within the inner bath 211 decreases gradually. As the concentration of the hydrofluoric acid component decreases, the measurement value obtained by the resistivity meter 217 increases gradually. The substrate processing apparatus 201 receives the measurement value obtained by the resistivity meter 217 to continuously monitor whether or not the measurement value reaches a predetermined reference value r1 (in Step S252). The reference value r1 used herein is a resistivity value of the processing liquid such that the hydrofluoric acid component in the processing liquid no longer causes the etching process of the substrates W to substantially proceed, and is set in the controller 250 based on a previous experiment and the like.

When the measurement value obtained by the resistivity meter 217 reaches the above-mentioned reference value r1, the substrate processing apparatus 201 closes the on-off valve 234*a* and opens the on-off valve 234*b*. This stops the discharge of the deionized water from the discharge nozzles 331, 332, 341 and 342, and starts the discharge of the deionized water from the discharge nozzles 351 and 352 (in Step S253).

Figure 16:
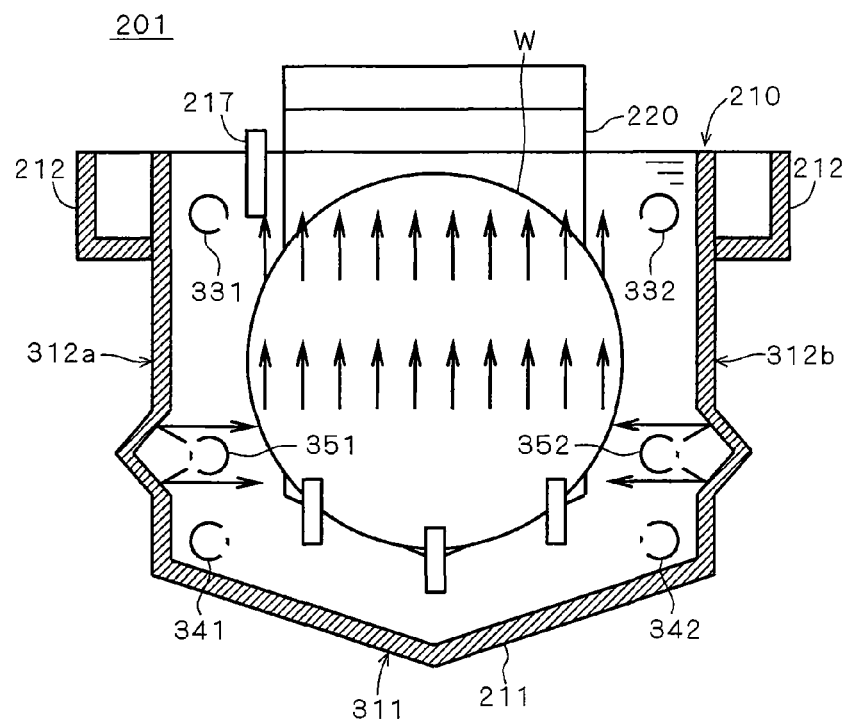
FIG. 16 is a view showing that the processing liquid is discharged from discharge nozzles toward the side walls of the inner bath.

The deionized water discharged from the discharge nozzles 351 and 352 impinges upon the grooves 216 formed in the side walls 312*a* and 312*b* of the inner bath 211 to diffuse, thereby turning toward the inside of the inner bath 211. Thus, low-speed uniform liquid flows directed upwardly from near the bottom portion of the inner bath 211 are formed within the inner bath 211, as shown in FIG. 16. Accordingly, the hydrofluoric acid component remaining within the inner bath 211 is drained from the top portion of the inner bath 211 into the outer bath 212 in such a manner as to be forced out by the low-speed liquid flows of deionized water. The replacement of the dilute hydrofluoric acid with the deionized water efficiently proceeds within the inner bath 211.

The substrate processing apparatus 201 continues to receive the measurement value obtained by the resistivity meter 217 to continuously monitor whether or not the measurement value reaches a predetermined reference value r2 (in Step S253). The reference value r2 used herein is a resistivity value of the processing liquid such that the hydrofluoric acid component in the processing liquid is judged to be almost completely drained and be almost completely replaced with the deionized water within the inner bath 211, and is previously set in the controller 250. When the resistivity value obtained by the resistivity meter 217 reaches the reference value r2, the procedure proceeds to the subsequent step, i.e., Step S206.

Referring again to FIG. 13, the substrate processing apparatus 201 continues the discharge of the deionized water from the discharge nozzles 351 and 352 as required after the measurement value obtained by the resistivity meter 217 reaches the above-mentioned reference value r2. The substrates W dipped in the deionized water stored in the inner bath 211 are subjected to a rinsing process with the deionized water (in Step S206).

Next, the substrate processing apparatus 201 supplies the SC-1 solution from the processing liquid supply source 231, with the on-off valve 234*a* maintained closed and the on-off valve 234*b* maintained open. The SC-1 solution supplied from the processing liquid supply source 231 flows through the main pipe 232 and the branch pipe 233*b* into the discharge nozzles 351 and 352, and is then discharged from the discharge nozzles 351 and 352 into the inner bath 211. The substrate processing apparatus 201 causes the processing liquid to overflow from the top portion of the inner bath 211 into the outer bath 212 while supplying the SC-1 solution into the inner bath 211, thereby gradually replacing the deionized water with the SC-1 solution within the inner bath 211 (in Step S207).

The SC-1 solution discharged from the discharge nozzles 351 and 352 impinges upon the grooves 216 formed in the side walls 312*a* and 312*b* of the inner bath 211 to diffuse, thereby turning toward the inside of the inner bath 211. Thus, low-speed uniform liquid flows directed upwardly from near the bottom portion of the inner bath 211 are formed within the inner bath 211, as shown in FIG. 16. Accordingly, the deionized water within the inner bath 211 is drained from the top portion of the inner bath 211 into the outer bath 212 in such a manner as to be forced out by the low-speed liquid flows of SC-1 solution. The replacement of the deionized water with the SC-1 solution efficiently proceeds within the inner bath 211.

The substrate processing apparatus 201 continues the discharge of the SC-1 solution from the discharge nozzles 351 and 352 as required after the replacement of the deionized water with the SC-1 solution is completed. The substrates W dipped in the SC-1 solution stored in the inner bath 211 are subjected to the liquid chemical cleaning process with the SC-1 solution (in Step S208).

Next, the substrate processing apparatus 201 supplies deionized water from the processing liquid supply source 231, with the on-off valve 234*a* maintained closed and the on-off valve 234*b* maintained open. The deionized water supplied from the processing liquid supply source 231 flows through the main pipe 232 and the branch pipe 233*b* into the discharge nozzles 351 and 352, and is then discharged from the discharge nozzles 351 and 352 into the inner bath 211. The substrate processing apparatus 201 causes the processing liquid to overflow from the top portion of the inner bath 211 into the outer bath 212 while supplying the deionized water into the inner bath 211, thereby gradually replacing the SC-1 solution with the deionized water within the inner bath 211 (in Step S209).

The deionized water discharged from the discharge nozzles 351 and 352 impinges upon the grooves 216 formed in the side walls 312*a* and 312*b* of the inner bath 211 to diffuse, thereby turning toward the inside of the inner bath 211. Thus, low-speed uniform liquid flows directed upwardly from near the bottom portion of the inner bath 211 are formed within the inner bath 211, as shown in FIG. 16. Accordingly, the SC-1 solution within the inner bath 211 is drained from the top portion of the inner bath 211 into the outer bath 212 in such a manner as to be forced out by the low-speed liquid flows of deionized water. The replacement of the SC-1 solution with the deionized water efficiently proceeds within the inner bath 211.

The substrate processing apparatus 201 continues the discharge of the deionized water from the discharge nozzles 351 and 352 as required after the replacement of the SC-1 solution with the deionized water is completed. The substrates W dipped in the deionized water stored in the inner bath 211 are subjected to the rinsing process with the deionized water (in Step S210).

Next, the substrate processing apparatus 201 supplies the SC-2 solution from the processing liquid supply source 231, with the on-off valve 234*a* maintained closed and the on-off valve 234*b* maintained open. The SC-2 solution supplied from the processing liquid supply source 231 flows through the main pipe 232 and the branch pipe 233*b* into the discharge nozzles 351 and 352, and is then discharged from the discharge nozzles 351 and 352 into the inner bath 211. The substrate processing apparatus 201 causes the processing liquid to overflow from the top portion of the inner bath 211 into the outer bath 212 while supplying the SC-2 solution into the inner bath 211, thereby gradually replacing the deionized water with the SC-2 solution within the inner bath 211 (in Step S211).

The SC-2 solution discharged from the discharge nozzles 351 and 352 impinges upon the grooves 216 formed in the side walls 312*a* and 312*b* of the inner bath 211 to diffuse, thereby turning toward the inside of the inner bath 211. Thus, low-speed uniform liquid flows directed upwardly from near the bottom portion of the inner bath 211 are formed within the inner bath 211, as shown in FIG. 16. Accordingly, the deionized water within the inner bath 211 is drained from the top portion of the inner bath 211 into the outer bath 212 in such a manner as to be forced out by the low-speed liquid flows of SC-2 solution. The replacement of the deionized water with the SC-2 solution efficiently proceeds within the inner bath 211.

The substrate processing apparatus 201 continues the discharge of the SC-2 solution from the discharge nozzles 351 and 352 as required after the replacement of the deionized water with the SC-2 solution is completed. The substrates W dipped in the SC-2 solution stored in the inner bath 211 are subjected to the liquid chemical cleaning process with the SC-2 solution (in Step S212).

Next, the substrate processing apparatus 201 supplies deionized water from the processing liquid supply source 231, with the on-off valve 234a maintained closed and the on-off valve 234b maintained open. The deionized water supplied from the processing liquid supply source 231 flows through the main pipe 232 and the branch pipe 233b into the discharge nozzles 351 and 352, and is then discharged from the discharge nozzles 351 and 352 into the inner bath 211. The substrate processing apparatus 201 causes the processing liquid to overflow from the top portion of the inner bath 211 into the outer bath 212 while supplying the deionized water into the inner bath 211, thereby gradually replacing the SC-2 solution with the deionized water within the inner bath 211 (in Step S213).

The deionized water discharged from the discharge nozzles 351 and 352 impinges upon the grooves 216 formed in the side walls 312a and 312b of the inner bath 211 to diffuse, thereby turning toward the inside of the inner bath 211. Thus, low-speed uniform liquid flows directed upwardly from near the bottom portion of the inner bath 211 are formed within the inner bath 211, as shown in FIG. 16. Accordingly, the SC-2 solution within the inner bath 211 is drained from the top portion of the inner bath 211 into the outer bath 212 in such a manner as to be forced out by the low-speed liquid flows of deionized water. The replacement of the SC-2 solution with the deionized water efficiently proceeds within the inner bath 211.

The substrate processing apparatus 201 continues the discharge of the deionized water from the discharge nozzles 351 and 352 as required after the replacement of the SC-2 solution with the deionized water is completed. The substrates W dipped in the deionized water stored in the inner bath 211 are subjected to the rinsing process with the deionized water (in Step S214).

Thereafter, the substrate processing apparatus 201 brings the driver 222 into operation to move the lifter 220 upwardly, thereby lifting the substrates W out of the inner bath 211 (in Step S215). Thus, the substrate processing apparatus 201 completes a series of processes of the set of substrates W.

When it is desired to cause the etching process to proceed uniformly within the inner bath 211 (in Steps S202 to S252 described above), the substrate processing apparatus 201 according to the second preferred embodiment discharges the processing liquid from the discharge nozzles 331, 332, 341 and 342 to form relatively high-speed liquid flows within the inner bath 211. This causes the hydrofluoric acid component to be agitated within the inner bath 211, thereby making the concentration of the hydrofluoric acid component uniform. When it is desired to efficiently replace the processing liquid stored within the inner bath 211 (in Steps S253 to S214 described above), the substrate processing apparatus 201 according to the second preferred embodiment discharges the processing liquid from the discharge nozzles 351 and 352 to form relatively low-speed liquid flows within the inner bath 211. This accomplish the efficient drainage of the processing liquid from the inner bath 211. In this manner, the substrate processing apparatus 201 according to the second preferred embodiment uses the discharge nozzles 331, 332, 341 and 342 and the discharge nozzles 351 and 352 properly depending on processing conditions to thereby satisfy both the requirement for uniform processing within the inner bath 211 and the requirement for efficient replacement of the processing liquid stored within the inner bath 211.

<2-3. Modifications>

Figure 17:
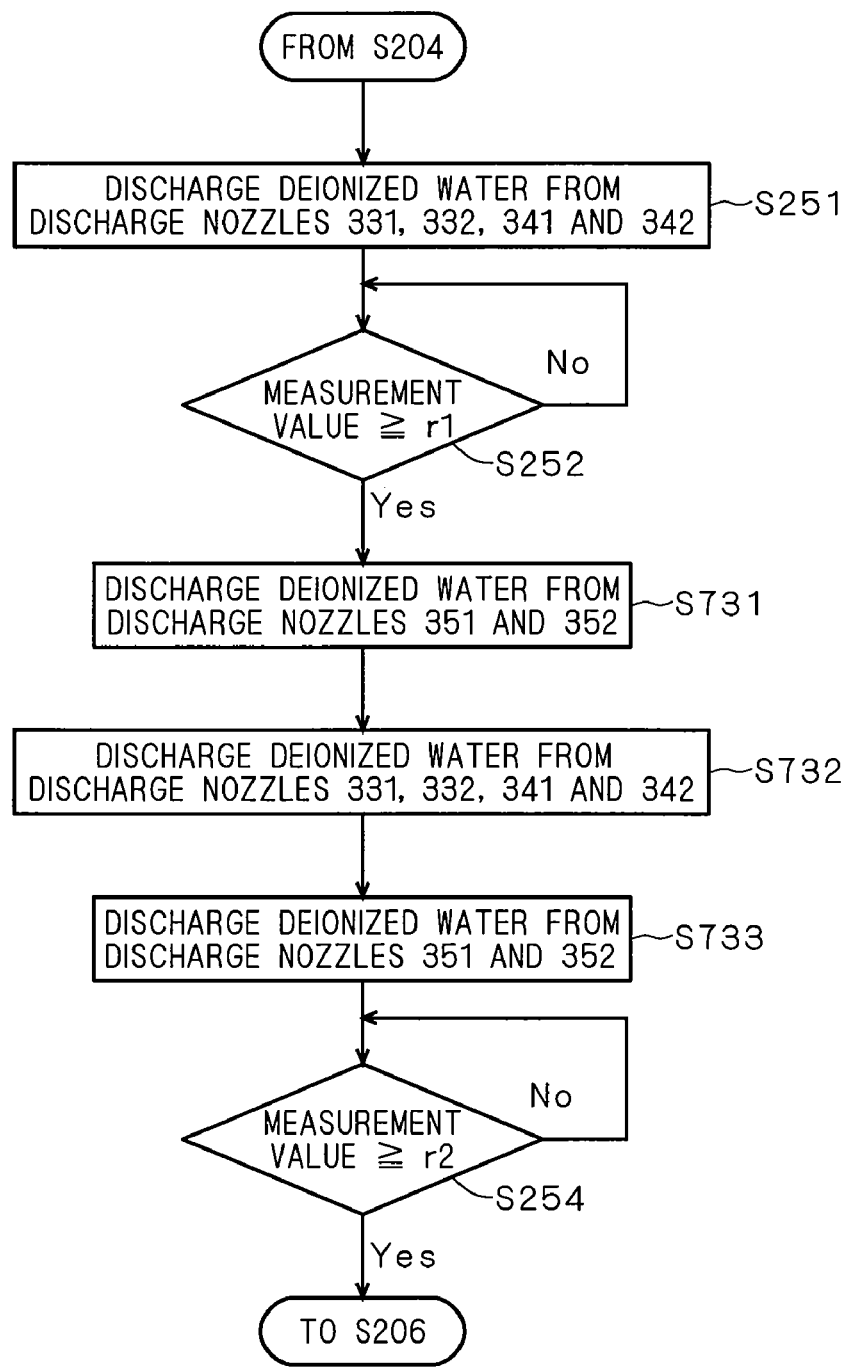
FIG. 17 is a flow diagram showing a modification of the procedure for the process of replacing the processing liquid.

Although the deionized water is discharged only from the discharge nozzles 351 and 352 in Step S253 described above, the operation in Step S253 may be replaced with the operation in Steps S731 to S733 shown in FIG. 17. Specifically, after the measurement value obtained by the resistivity meter 217 reaches the reference value r1, the discharge of deionized water from the discharge nozzles 351 and 352 (in Step S731), the discharge of deionized water from the discharge nozzles 331, 332, 341 and 342 (in Step S732) and the discharge of deionized water from the discharge nozzles 351 and 352 (in Step S733) may be performed in order.

The execution of the discharge of deionized water from the discharge nozzles 351 and 352 and the discharge of deionized water from the discharge nozzles 331, 332, 341 and 342 in an alternating manner allows the hydrofluoric acid component remaining near the surfaces of the substrates W and the surfaces of the members of the lifter 220 to be efficiently drained while allowing the hydrofluoric acid component to be agitated by the deionized water discharged from the discharge nozzles 331, 332, 341 and 342. Each of the discharge of deionized water from the discharge nozzles 351 and 352 and the discharge of deionized water from the discharge nozzles 331, 332, 341 and 342 may be performed, for example, for on the order of 10 to 20 seconds, and the number of repetitions thereof is not limited to that illustrated in the instance of FIG. 17. For good completion of the replacement of the dilute hydrofluoric acid with the deionized water, it is desirable that the last process is the discharge of deionized water from the discharge nozzles 351 and 352. In Steps S206 to S214 subsequent thereto, the discharge of the processing liquid from the discharge nozzles 351 and 352 and the discharge of the processing liquid from the discharge nozzles 331, 332, 341 and 342 may be similarly repeatedly performed in an alternating manner.

In the second preferred embodiment described above, the discharge nozzles 331 and 332 are disposed near the top portion of the inner bath 211, the discharge nozzles 341 and 342 are disposed near the bottom portion of the inner bath 211, and the discharge nozzles 351 and 352 are disposed above and near the discharge nozzles 341 and 342. The positional relationship between the discharge nozzles 331, 332, 341, 342, 351 and 352 is not necessarily limited to this. For example, the discharge nozzles 351 and 352 may be disposed below the discharge nozzles 341 and 342.

Although the discharge nozzles 351 and 352 discharge the processing liquid toward the side walls 312a and 312b of the inner bath 211 according to the second preferred embodiment described above, the discharge nozzles 351 and 352 may discharge the processing liquid toward the bottom wall 311 of the inner bath 211. In other words, the discharge nozzles 351 and 352 are required only to discharge the processing liquid toward any inner wall surface of the inner bath 211. It is desirable that the inner wall surface of the inner bath 211 which receives the processing liquid discharged from the discharge nozzles 351 and 352 is formed with the grooves 216 as in the second preferred embodiment. Without the formation of the grooves 216, it is however possible to diffuse the processing liquid discharged from the discharge nozzles 351 and 352, thereby forming low-speed liquid flows within the inner bath 211.

The diameter of the discharge openings 331a, 332a, 341a, 341b, 342a, 342b, 351a, 351b, 352a and 352b formed in the discharge nozzles 331, 332, 341, 342, 351 and 352 is not particularly mentioned according to the second preferred embodiment described above. The discharge openings 331a, 332a, 341a, 341b, 342a and 342b may have a diameter of the order of, for example, 0.70 mm to 1.0 mm (e.g., 0.85 mm), and the discharge openings 351a, 351b, 352a and 352b may have a diameter of the order of, for example, 0.80 mm to 1.50 mm (e.g., 1.10 mm). The discharge openings 331a, 332a, 341a, 341b, 342a, 342b, 351a, 351b, 352a and 352b may have the same diameter. However, when the diameter of the discharge openings 351a, 351b, 352a and 352b is slightly greater than that of the discharge openings 331a, 332a, 341a, 341b, 342a and 342b, a difference in speed between the liquid flows formed in the inner bath 211 may be made greater.

The grooves 216 according to the second preferred embodiment described above are grooves of a V-shaped cross-sectional configuration defined by the pair of tapered surfaces 216a and 216b. The configuration of the grooves 216, however, may be other configurations such as a curved surface (semicylindrical) and the like.

Although the second preferred embodiment described above employs the dilute hydrofluoric acid, the SC-1 solution, the SC-2 solution and the deionized water as the processing liquid, the substrate processing apparatus according to the present invention may use other processing liquids to process the substrates W. The present invention is applicable not only to a substrate processing apparatus which processes semiconductor substrates but also to substrate processing apparatuses which process various substrates such as glass substrates for a liquid crystal display device, glass substrates for a photomask and the like.

While the invention has been described in detail, the foregoing description is in all aspects illustrative and not restrictive. It is understood that numerous other modifications and variations can be devised without departing from the scope of the invention.

What is claimed is:

1. A substrate processing apparatus for processing a substrate by dipping the substrate in a processing liquid, said substrate processing apparatus comprising:
    a processing bath having a side wall and a bottom wall for storing the processing liquid therein;
    a first discharge part for discharging the processing liquid toward one of said side wall and said bottom wall within said processing bath; a discharge opening of said first discharge part being disposed to face one of said side wall or said bottom wall, located on the opposite side of the substrate inside said processing bath, across said first discharge part;
    a drainage part for draining the processing liquid overflowing from a top portion of said processing bath; and
    a lifter for moving the substrate upwardly and downwardly between the inside of said processing bath and a position over said processing bath.

2. The substrate processing apparatus according to claim 1, wherein
    said first discharge part discharges the processing liquid toward a recessed portion formed in one of said side wall and said bottom wall.

3. The substrate processing apparatus according to claim 2, wherein
    said first discharge part has a pair of discharge nozzles, and said pair of discharge nozzles discharge the processing liquid toward recessed portions formed in a pair of opposed side walls, respectively, of said processing bath.

4. The substrate processing apparatus according to claim 3, wherein
    said recessed portions are formed in lower end portions of said pair of opposed side walls, respectively.

5. The substrate processing apparatus according to claim 4 wherein
    each of said recessed portions is a groove of a V-shaped cross-sectional configuration opening to the inside of said processing bath.

6. The substrate processing apparatus according to claim 5, wherein
    said groove of the V-shaped cross-sectional configuration is defined by a pair of tapered surfaces, and
    each of said pair of discharge nozzles discharges the processing liquid toward a lower one of said pair of tapered surfaces.

7. The substrate processing apparatus according to claim 4, wherein
    each of said recessed portions is a groove having the shape of a curved surface opening to the inside of said processing bath.

8. The substrate processing apparatus according to claim 1, further comprising:
    a second discharge part for discharging the processing liquid toward the inside of said processing bath; and
    a controller for individually controlling the operation of said first discharge part and the operation of said second discharge part depending on the progress of processing,
    wherein the processing liquid discharged from said first discharge part impinges upon an inner wall surface of said processing bath to thereby form a liquid flow within said processing bath, said liquid flow being lower in speed than that of the processing liquid discharged from said second discharge part.

9. The substrate processing apparatus according to claim 8, wherein
    said first discharge part discharges the processing liquid toward a recessed portion formed in said inner wall surface of said processing bath.

10. The substrate processing apparatus according to claim 9, wherein
    said second discharge part has a first nozzle disposed near a bottom portion of said processing bath, and a second nozzle disposed near the top portion of said processing bath, and
    said first discharge part has a third nozzle disposed above said first nozzle near the bottom portion of said processing bath.

11. The substrate processing apparatus according to claim 10, wherein
    said first nozzle includes a pair of first nozzles disposed on opposite sides of a region in which the substrate is dipped in the processing liquid within said processing bath,
    said second nozzle includes a pair of second nozzles disposed on opposite sides of said region, and
    said third nozzle includes a pair of third nozzles disposed on opposite sides of said region.

12. The substrate processing apparatus according to claim 11, wherein
    said processing liquid includes an etchant for execution of an etching process on the substrate, and a non-etching liquid for execution of another process, and said controller causes said second discharge part to discharge said etchant when supplying said etchant to the inside of said processing bath.

13. The substrate processing apparatus according to claim 12, further comprising
a measurement part for measuring one of the concentration of the component of said etchant contained in the processing liquid stored within said processing bath and the resistivity value of the processing liquid,
wherein said controller causes said second discharge part to discharge said non-etching liquid when replacing said etchant stored within said processing bath with said non-etching liquid, and
wherein said controller causes said second discharge part to stop discharging said non-etching liquid and causes said first discharge part to discharge said non-etching liquid when a measurement value obtained by said measurement part reaches a predetermined value.

14. The substrate processing apparatus according to claim 13, wherein
when replacing the processing liquid stored within said processing bath with a second processing liquid, said controller causes the discharge of said second processing liquid from said second discharge part and the discharge of said second processing liquid from said first discharge part in an alternating manner.

15. A method of processing a substrate by dipping the substrate in a processing liquid, said method comprising the steps of:
a) discharging the processing liquid toward one of a side wall and a bottom wall of a processing bath within said processing bath; a discharge part for discharging said processing liquid discharges said processing liquid toward one of said side wall, or said bottom wall located on the opposite side of the substrate inside said processing bath, across said discharge part; and
b) dipping the substrate in the processing liquid stored within said processing bath.

* * * * *